United States Patent
Fitzsimmons et al.

(10) Patent No.: US 12,261,123 B2
(45) Date of Patent: Mar. 25, 2025

(54) SELECTIVE METALLIZATION OF INTEGRATED CIRCUIT PACKAGES

(71) Applicant: Advanced Technical Ceramics Company, Chattanooga, TN (US)

(72) Inventors: Aaron Fitzsimmons, Chattanooga, TN (US); William T. Minehan, Chattanooga, TN (US)

(73) Assignee: Advanced Technical Ceramics Company, Chattanooga, TN (US)

( * ) Notice: Subject to any disclaimer, the term of this patent is extended or adjusted under 35 U.S.C. 154(b) by 0 days.

(21) Appl. No.: 17/659,391

(22) Filed: Apr. 15, 2022

(65) Prior Publication Data

US 2022/0344269 A1    Oct. 27, 2022

Related U.S. Application Data

(63) Continuation of application No. 16/051,093, filed on Jul. 31, 2018, now Pat. No. 11,309,251.

(Continued)

(51) Int. Cl.
*H01L 23/538* (2006.01)
*H01L 21/02* (2006.01)
(Continued)

(52) U.S. Cl.
CPC .... *H01L 23/5383* (2013.01); *H01L 21/02527* (2013.01); *H01L 21/02529* (2013.01);
(Continued)

(58) Field of Classification Search
CPC . H01L 23/53; H01L 23/3735; H01L 23/3677; H01L 23/49827; H01L 21/02527;
(Continued)

(56) References Cited

U.S. PATENT DOCUMENTS 4,590,095 A    5/1986    Park
4,626,479 A  * 12/1986   Hosoi ................. B32B 15/01
                                                  257/781

(Continued)

FOREIGN PATENT DOCUMENTS

JP    2015-185820 A    10/2015

OTHER PUBLICATIONS

Bruder M. et al., "Advanced Surface Finishes for Ceramic Electronics for Soldering, Conductive Adhesive, Aluminum, Gold, and Copper Wire Bonding", Atotech Deutschland GmbH, vol. 2013 dated Sep. 2013.

(Continued)

*Primary Examiner* — Vongsavanh Sengdara
(74) *Attorney, Agent, or Firm* — Knobbe, Martens, Olson & Bear, LLP

(57) ABSTRACT

The disclosed technology generally relates to metallization of substrates, and more particularly to selective metallization of ceramic substrates. A method of selectively metallizing a substrate includes forming a base metal layer comprising a refractory metal on a substrate, forming a base nickel (Ni) layer over the base metal layer by a vapor phase process, forming a palladium (Pd) layer on the base Ni layer by electroless plating, and forming a gold (Au) layer on the Pd layer.

30 Claims, 20 Drawing Sheets

Related U.S. Application Data

(60) Provisional application No. 62/539,329, filed on Jul. 31, 2017.

(51) Int. Cl.
  *H01L 23/00* (2006.01)
  *H01L 23/367* (2006.01)
  *H01L 23/373* (2006.01)
  *H01L 23/498* (2006.01)
  *H01L 23/15* (2006.01)

(52) U.S. Cl.
  CPC .... *H01L 21/0254* (2013.01); *H01L 21/02554* (2013.01); *H01L 23/3677* (2013.01); *H01L 23/3735* (2013.01); *H01L 23/49827* (2013.01); *H01L 24/09* (2013.01); *H01L 23/15* (2013.01); *H01L 24/48* (2013.01); *H01L 2224/32225* (2013.01); *H01L 2224/48091* (2013.01); *H01L 2224/48227* (2013.01); *H01L 2224/73265* (2013.01); *H01L 2924/01028* (2013.01); *H01L 2924/01046* (2013.01); *H01L 2924/01079* (2013.01); *H01L 2924/15153* (2013.01); *H01L 2924/15313* (2013.01); *H01L 2924/15787* (2013.01)

(58) Field of Classification Search
  CPC ......... H01L 21/02554; H01L 21/02529; H01L 21/0254; H01L 24/09; H01L 24/32; H01L 24/48; H01L 23/15; H01L 23/5383; H01L 2224/32225; H01L 2224/48091; H01L 2224/48227; H01L 2224/73265; H01L 2924/00012; H01L 2924/00014; H01L 2924/01028; H01L 2924/01046; H01L 2924/01079; H01L 2924/15153; H01L 2924/15313; H01L 2924/15787
  See application file for complete search history.

(56) References Cited

U.S. PATENT DOCUMENTS

| | | | |
|---|---|---|---|
| 4,664,942 A | 5/1987 | Park | |
| 4,941,582 A | 7/1990 | Morikawa et al. | |
| 5,206,055 A * | 4/1993 | Iacovangelo | H05K 3/244 |
| | | | 427/443.1 |
| 5,869,134 A | 2/1999 | Reddy et al. | |
| 5,897,965 A | 4/1999 | Itoh et al. | |
| 6,224,682 B1 | 5/2001 | Wall et al. | |
| 6,225,569 B1 | 5/2001 | Hashimoto et al. | |
| 6,254,925 B1 | 7/2001 | Natarajan et al. | |
| 6,319,554 B1 | 11/2001 | Natarajan et al. | |
| 6,569,496 B1 | 5/2003 | Wall et al. | |
| 6,974,776 B2 | 12/2005 | Dean et al. | |
| 8,852,734 B2 | 10/2014 | Tanaka et al. | |
| 9,125,333 B2 * | 9/2015 | Uzoh | H05K 1/09 |
| 9,150,002 B2 | 10/2015 | Lee et al. | |
| 9,175,222 B2 | 11/2015 | Sago et al. | |
| 10,804,174 B2 | 10/2020 | Kapusta et al. | |
| 11,309,251 B2 | 4/2022 | Fitzsimmons et al. | |
| 2005/0093146 A1 * | 5/2005 | Sakano | H05K 3/3442 |
| | | | 257/730 |
| 2005/0218506 A1 | 10/2005 | Geisler et al. | |
| 2009/0115074 A1 | 5/2009 | Hammer et al. | |
| 2012/0177853 A1 | 7/2012 | Gruenwald | |
| 2014/0009875 A1 | 1/2014 | Nakagawa et al. | |
| 2016/0157341 A1 | 6/2016 | Lee et al. | |
| 2017/0148718 A1 | 5/2017 | Morita | |
| 2019/0013239 A1 * | 1/2019 | Wu | H01L 23/15 |
| 2019/0035735 A1 | 1/2019 | Fitzsimmons et al. | |

OTHER PUBLICATIONS

"Ceramic QFN Family", Barry Industries, Inc., Attleboro, Massachusetts in 4 pages.

Johal K. et al., "Electroless Nickel / Electroless Palladium / Immersion Gold Plating Process for Goldand Aluminum-Wire Bonding Designed for High-Temperature Applications" Atotech Deutschland GmbH, Berlin, Germany in 8 pages.

McGillivray, "High Temperature Cofired Ceramic (HTCC) Package Design and Applications," AMETEK ECP Electronic Packaging, May 6, 2014 in 39 pages.

Milad, G. "ENEPIG: A Final Finish That's Time Has Come" dated May 1, 2020 in 5 pages.

"Talon 3.0" Uyemura USA Technical Information, Rev. 4/16, G in 7 pages.

"Techni IM Gold AT 6000," Technic Inc. Technical Data, X—ATD130100—Rev 0316 1 in 7 pages.

"Technic EN AT 5600" Technic Inc. Technical Data, 405674—New 0811 in 11 pages.

The pcb Magazine, Plating and Etching, I-Connect007 Publication, May 2015 in 73 pages.

Wikipedia, "Electroless nickel-phosphorus plating," https://en.wikipedia.org/wiki/Electroless_nickel-phosphorus_plating, This page was last edited on Dec. 13, 2023.

Wikipedia, "Electroless nickel-boron plating," https://en.wikipedia.org/wiki/Electroless_nickel-boron_plating, This page was last edited on Mar. 10, 2023.

Extended European Search Report received in EP Application No. EP 24162631 dated Jun. 10, 2024 in 24 pages.

* cited by examiner

SELECTIVE METALLIZATION OF INTEGRATED CIRCUIT PACKAGES

CROSS-REFERENCE TO RELATED APPLICATIONS

This application is a Continuation of U.S. patent application Ser. No. 16/051,093, filed Jul. 31, 2018, entitled "SELECTIVE METALLIZATION OF INTEGRATED CIRCUIT PACKAGES," which claims the benefit of priority to U.S. Provisional Patent Application No. 62/539,329, filed Jul. 31, 2017, entitled "SELECTIVE METALLIZATION OF INTEGRATED CIRCUIT PACKAGES," the content of which is hereby incorporated by reference herein in its entirety.

BACKGROUND

Field

The disclosed technology generally relates to metallization of substrates, and more particularly to selective metallization of ceramic substrates.

Description of the Related Art

Packages for integrated circuit (IC) devices physically and electrically connect the IC devices to their interfaces to the outside world, e.g., printed circuit boards (PCBs). As electronic devices continue to shrink in size, incorporate multiple functionalities and/or find specialized applications, the demand for higher electrical and thermal performance of the packaging technology for many components and modules of the electronic devices, including the integrated circuit (IC) devices, continues to increase.

SUMMARY

In one aspect, a method of selectively metallizing a ceramic substrate includes forming a base metal layer comprising a refractory metal on the ceramic substrate, forming a nickel (Ni) layer over the base metal layer by electroless plating, forming a palladium (Pd) layer on the Ni layer by electroless plating, and forming a gold (Au) layer on the Pd layer.

In another aspect, a method of selectively metallizing a substrate includes providing a substrate, forming a base metal layer comprising a refractory metal on the substrate, forming a base nickel (Ni) layer on the base metal layer by a vapor phase process, forming a palladium (Pd) layer on the base Ni layer by electroless plating, and forming a gold (Au) layer on the Pd layer.

In another aspect, a ceramic package configured to house an integrated circuit die includes a ceramic substrate, a base metal layer comprising a refractory metal formed on the ceramic substrate, a nickel (Ni) layer formed on the base metal layer, wherein the Ni layer is substantially free of P and B adjacent to the base metal layer, a palladium (Pd) layer formed on the Ni layer, and a gold layer formed on the palladium layer.

In another aspect, a ceramic package configured to house an integrated circuit die includes a ceramic substrate, a first base metal layer and a second base metal layer formed at different locations on the ceramic substrate and comprising a refractory metal. Each of the first and second base metal layers have formed thereover a nickel (Ni) layer, a palladium (Pd) layer formed on the Ni layer and a gold (Au) layer formed on the palladium layer.

DETAILED DESCRIPTION

The disclosed technology relates metalizing substrates, e.g., packages for various active and passive electronic components, such as integrated circuit (IC) devices, piezoelectric devices, photonic devices and sensors such as image sensors, to name a few. Various integrated circuit (IC) devices are physically and electrically connected the outside world through packages. The packages provide an electrical connection for the IC devices to the outside world through an interface, e.g., printed circuit board (PCB). As electronic devices continue to shrink in size, incorporate multiple functionalities and/or find specialized applications, the demand for higher electrical and thermal performance of the packaging technology for many components and modules of the electronic devices, including the integrated circuit (IC) devices, continues to increase. For example, for some very high reliability packages, it may be desirable to use a high temperature co-fired ceramic (HTCC) process, with the aim of achieving a plating process and a sealing between a lid and ceramic enclosure that produce very low outgasing, nearly void-free solder joint and a hermetic seal. The industry has made a significant effort with very limited success to employ different variations of combining traditional plating processes, e.g., electrolytic plating or electroless Ni plating in conjunction with traditional high temperature co-firing processes to achieve the desired sealing results. Thus, there is an unmet need for high performance and high reliability packaging of IC devices with metallization structures leading to fewer electrical shorts, higher planarity, improved adhesion, higher temperature tolerance and higher hermetic sealing performance, to name a few attributes. To address these and other needs, described herein are various embodiments directed to selective metallization of substrates, e.g., ceramic substrates, for IC devices.

IC Packages Having Selective Metallization Formed on a Base Metal Layer

Figure 1A:
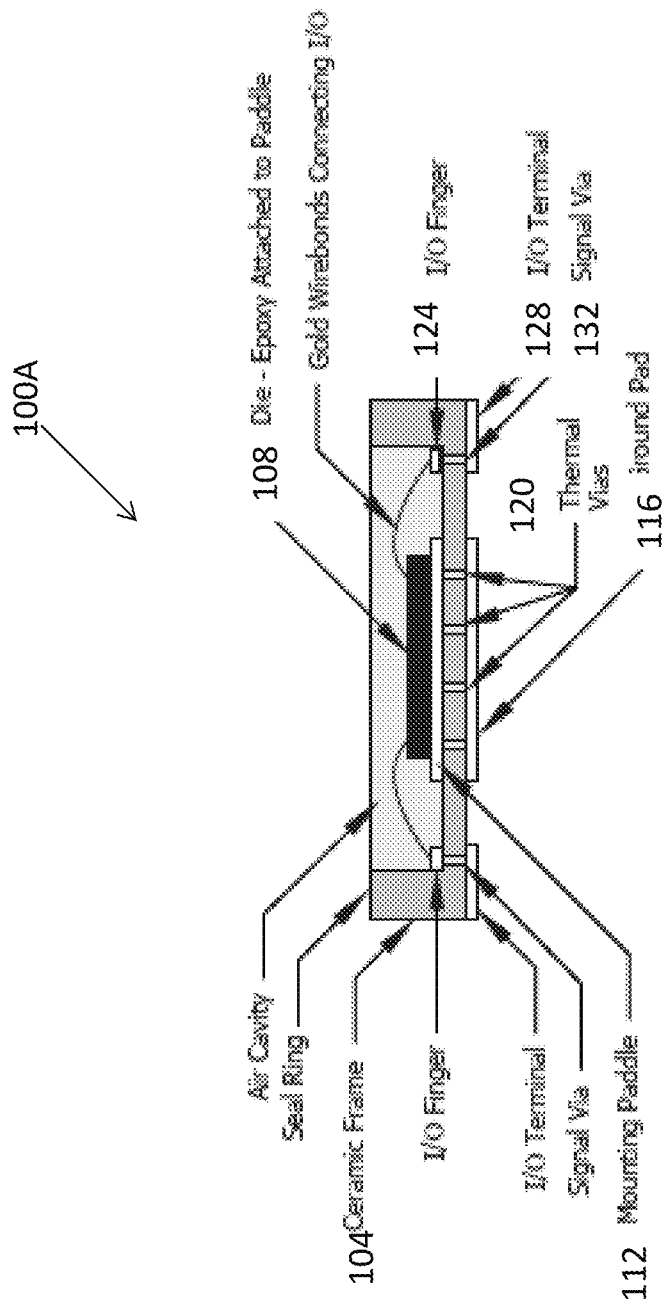
FIG. 1A illustrates a ceramic package housing therein an IC die, where the ceramic package includes metallization structures formed by a selective deposition process, according to some embodiments.

FIG. 1A illustrates a ceramic package 100A housing therein an IC die 108, where the ceramic package includes metallization structures formed by a selective deposition process (FIG. 2B), according to some embodiments. The ceramic package 100A includes a ceramic substrate 104, or a ceramic frame, configured to house the IC die 108 therein and to provide thermal and electrical communication between the IC die 108 and the outside world. The ceramic package 100 is configured to provide thermal communication between the IC die 108 and an interface to the outside world, e.g., a PCB (not shown), through one or more metallization structures. The one or more metallization structures configured to provide the thermal communication include one or more of an inner thermal pad 112, an outer thermal pad 116 and one or more thermal vias 120. The inner thermal pad 112, e.g., a mounting pad or paddle, may be physically attached and configured to be in thermal communication with, e.g., to carry heat away from, the IC die 108. The outer thermal pad 116, e.g., a ground pad 116, is configured to be in thermal communication with, e.g., transfer heat to, an interface to the outside world, e.g., a PCB. The one or more vias 120, e.g., thermal vias, thermally connect the inner thermal pad 112 and the outer thermal pad 116 to provide the thermal communication therebetween. The ceramic package 100 is additionally configured to provide electrical communication between the IC die 108 and an interface to the outside world, e.g., a PCB, through one or more metallization structures. The one or more metallization structures configured to provide the electrical communication include one or more of an inner thermal electrical pad 124, an outer electrical pad 128 and one or more electrical vias 132. The inner electrical pad 124, e.g., an I/O finger, is configured to be in electrical communication with the IC die 108, e.g., through a wirebond. The outer electrical pad 128, e.g., an I/O terminal, is configured to be in electrical communication with an interface to the outside world, e.g., a PCB. The one or more vias 132, e.g., electrical vias, electrically connect the inner electrical pad 124 and the outer electrical pad 128 to provide the electrical communication therebetween. As described herein, while certain structures may be described as thermally conducting structures and other structures may be described as electrically conducting structures, it will be appreciated that under some configurations, thermally conducting structures and electrically conducting structures can be configured to serve as one or both electrically conducting structures and thermally conducting structures.

Figure 1B:
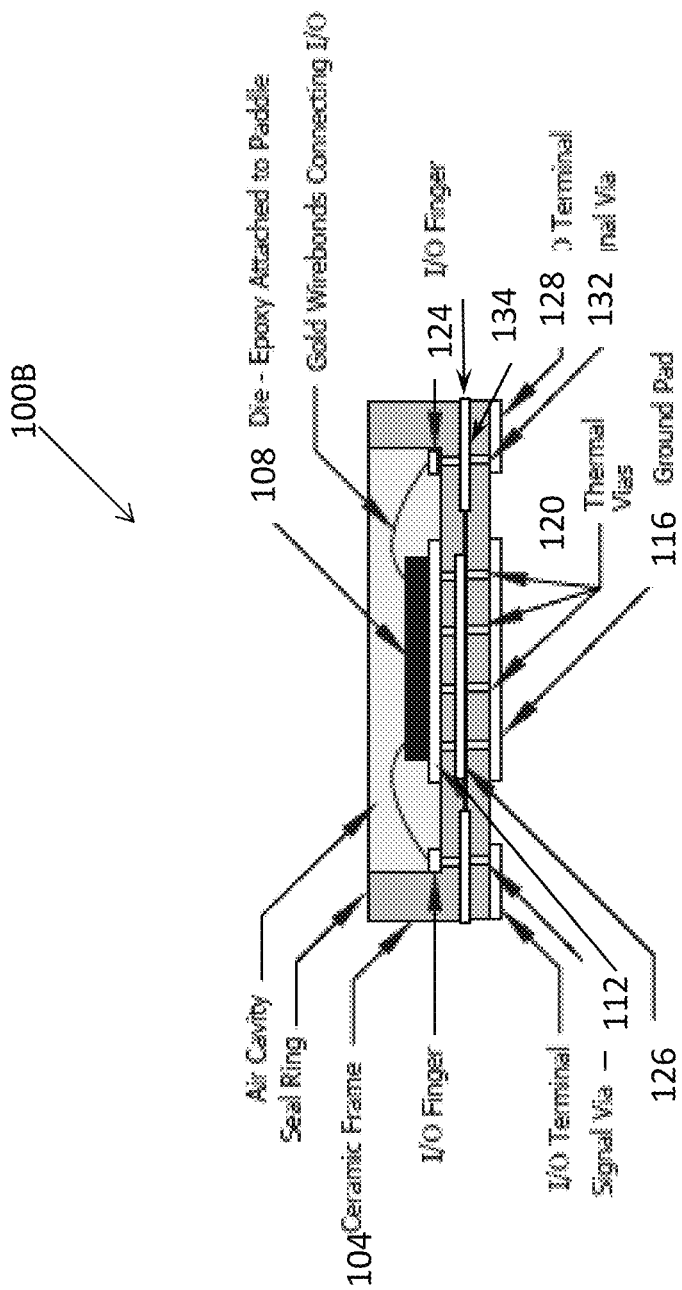
FIG. 1B illustrates a ceramic package housing therein an IC die, where the ceramic package includes a plurality of levels of metallization structures formed by a selective deposition process, according to some other embodiments.

While the ceramic package 100A illustrated with respect FIG. 1A is shown as having a single ceramic layer and a single level of metallization structures interposed between the IC die 108 and an interface to the outside world, e.g., a PCB, embodiments are not so limited. FIG. 1B illustrates a ceramic package 100B housing therein an IC die 108, where the ceramic package 100B includes a plurality of levels of metallization structures formed by a selective deposition process, according to some other embodiments. The ceramic package 100B is similar to the ceramic package 100A (FIG. 1A), except that the ceramic package 100B has two or more layers of ceramic layers (two layers shown in FIG. 1B for clarity) interposed between the IC die 108 and the outside world, e.g., a PCB (not shown). In the ceramic package 100B, thermally conducting components include, in addition to the inner thermal pad 112 and the outer thermal pad 116, one or more intermediate thermal pads 126 formed at one or more vertical levels and one or more vias 120, e.g., thermal vias, formed at different vertical levels that thermally connect the inner thermal pad 112, the one or more intermediate thermal pads 126 and the outer thermal pad 116. In addition, electrically conducting components include, in addition to the inner electrical pad 124 and the outer electrical pad 128, one or more intermediate electrical pads 134 formed at one or more vertical levels, and one or more vias 134 formed at different vertical levels, that electrically connect the inner electrical pad 124, the one or more intermediate electrical pads 134 and the outer electrical pad 128.

Figure 1C:
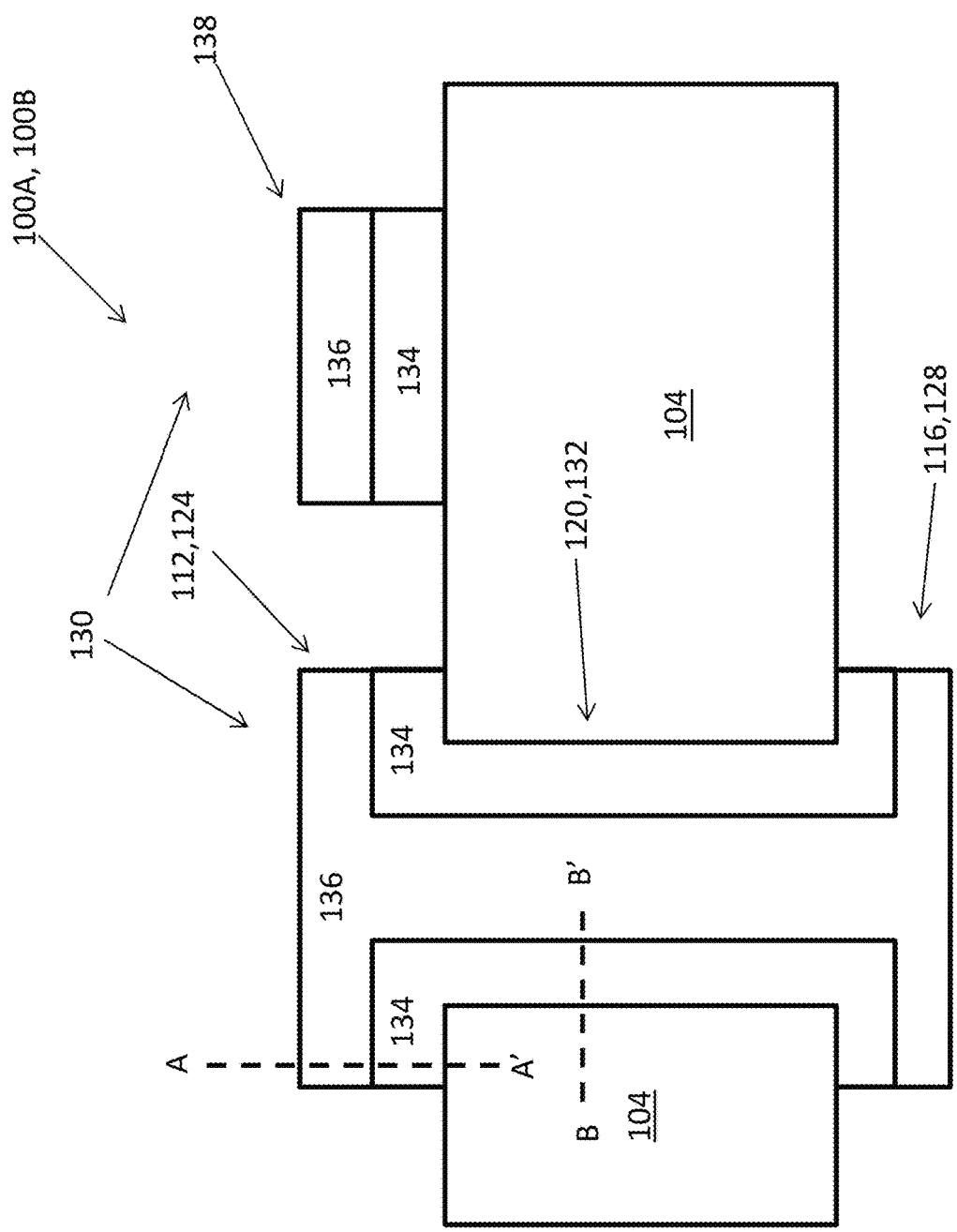
FIG. 1C illustrates a portion of the ceramic packages illustrated in FIGS. 1A and 1B, where the portion includes thermally/electrically conducting structures that provide thermal/electrical communication between the IC die and an interface to the outside world, according to some embodiments.
Figure 1D:
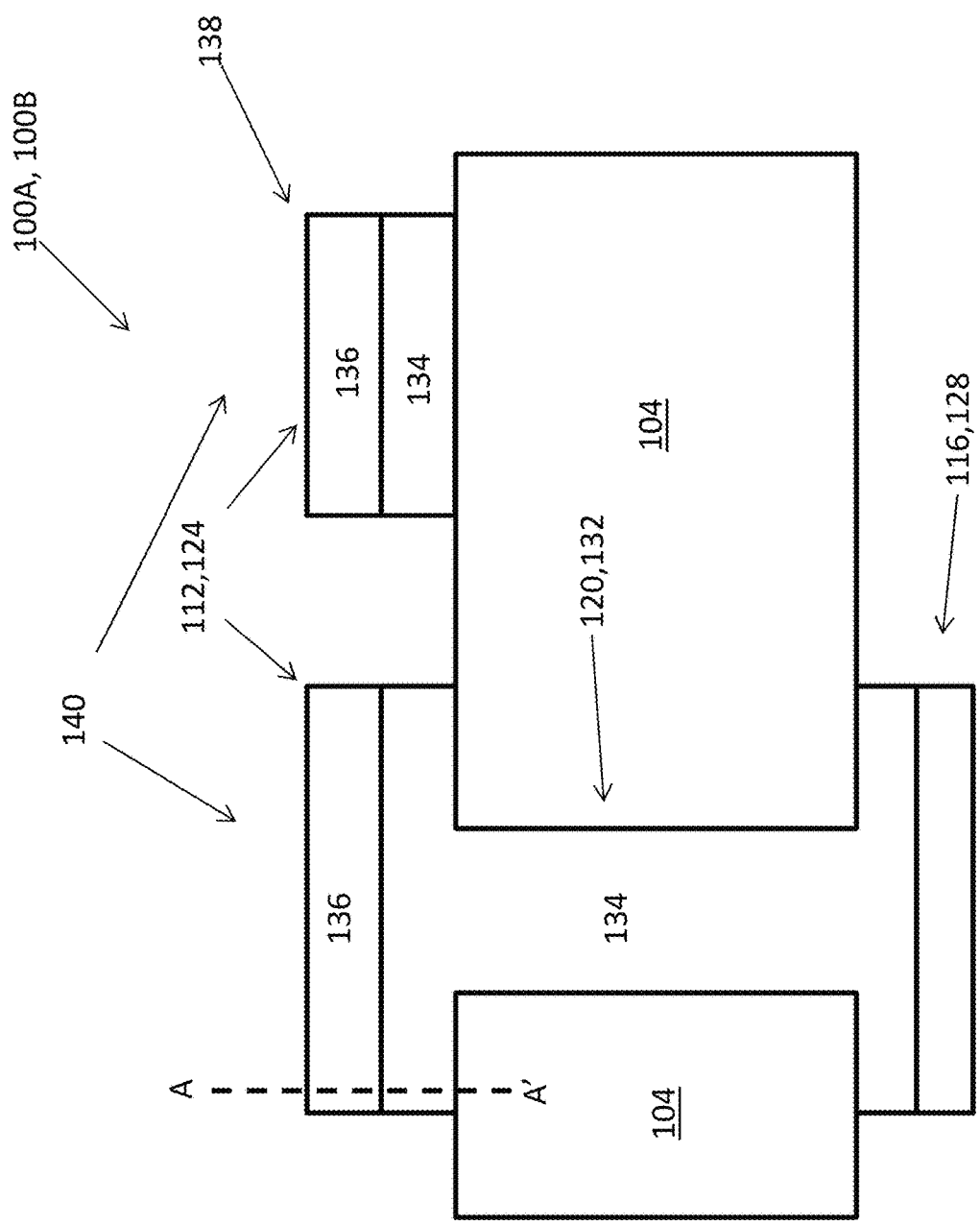
FIG. 1D illustrates a portion of the ceramic packages illustrated in FIGS. 1A and 1B, where the portion includes thermally/electrically conducting structures that provide thermal/electrical communication between the IC die and an interface to the outside world, according to some other embodiments.

FIGS. 1C and 1D illustrate portions of the ceramic packages 100A (FIG. 1A) and/or 100B (FIG. 1B) having metallization structures 130, 140 that provide thermal/electrical communication between the IC die 108 (FIGS. 1A and 1B) and an interface to the outside world, e.g., a PCB, according to embodiments. In particular, the portion of the ceramic package illustrates a detailed view of the metallization structures 130 that includes the inner thermal/electrical pad 112/124, the outer thermal/electrical pad 116/128 and the via 120/132. The metallization structures 130 may additionally include one or more circuit elements 138, e.g., a passive circuit element such as a conductor (e.g., a wire), an electrode or a resistor, among other circuit elements. According to embodiments, the metallization structures 130 includes a base metal layer 134 comprising a refractory metal formed on or in the ceramic substrate 104 and a one or more layers of a stack 136 of metallization layers. As described herein, a refractory metal can be one of Mo, W, Re, Nb and Ta. In some embodiments, the refractory metal is deposited using a suitable technique, e.g., by screen printing, stencil printing, spin coating, applied by inks by various means including rollers, vacuum coating, dipping in a dispersion or by means of thin film processing such as sputtering or evaporation and can be, e.g., tungsten (W) or molybdenum (Mo). The stack 136 of metallization layers includes a first nickel (Ni) layer formed on the base metal layer 134, a second Ni layer formed on the first Ni layer, a palladium (Pd) layer formed on the second Ni layer and a gold (Au) layer formed on the Pd layer, as described in detail below (e.g., FIGS. 2B, 3A-3F). According to various embodiments, the first Ni layer is deposited by a vapor phase process, the second Ni layer and the Pd layer are deposited by electroless-deposition and the Au layer is formed by an immersion process. In various embodiments, the first Ni layer can be substantially free of P and B. In the embodiment illustrated with respect to FIG. 1C, the via 120/132 has a width that is substantially wider than twice the thickness of the base metal layer 134 formed therein. Accordingly, both the base metal layer 134 and one or more layers of the stack 136 fill the via 120/132 and vertically extend through the ceramic substrate 104. In contrast, in the embodiment illustrated with respect to FIG. 1D, the via 120/132 has a width that is substantially the same or narrower than twice the thickness of the base metal layer 134 formed therein. Accordingly, the base metal layer 134 substantially fills the via 120/132, which may be substantially free of the one or more layers of the stack 136, and extends through the ceramic substrate 104, while the stack 136 is formed on the surface of the base metal layer 134 outside of the via 120/132.

Still referring to FIGS. 1C and 1D, in the illustrated embodiments, all layers of different ones (e.g., the circuit elements 138, vias 112/124) of the metallization structures 130, 140 are physically separated. However, embodiments are not so limited and in other embodiments, one or more layers of the different ones of the metallization structures 130, 140 are continuous. For example, the base metal layer 134 may form a continuous layer between different ones of the metallization structures 130, 140.

Still referring to FIGS. 1C and 1D, in the illustrated embodiments, the via structures 120, 130 may be used to form a hermetic seal to protect the IC enclosed by the ceramic substrate. However, when the via structures are not used to form a hermetic seal, the vias 120, 130 may not be filled to close off the opening. For example, in the embodiment illustrated with respect to FIG. 1C, the stack 136 may not completely fill or may be omitted from the openings of the vias 120, 132.

In some embodiments, the illustrated ceramic packages 100A/100B are flat no-leads (FN) packages, which can be, e.g., quad-flat no-leads (QFN) package or a dual-flat no-leads (DFN) package. Like other semiconductor package technologies, flat no-leads packages are configured to connect (both physically and electrically) ICs to a PCB using a surface-mount technology. FN packages can have a single or a multiple rows of pins. FN packages have an exposed thermal pad on the bottom of the package that can be soldered directly to a system PCB for optimal thermal transfer of heat from the die.

Some FN packages can be air-cavity flat no-leads packages having an air cavity designed into the package. Some FN packages can be plastic-molded flat no-leads packages having reduced air in the package compared to air-cavity flat no-leads packages. Some plastic-molded FN packages are used in relatively low frequency applications, e.g., less than about ~2-3 GHz. Plastic molded FN packages include a plastic compound filling a cavity in the packages without having a lid. In contrast, air-cavity FN packages are used in relatively high frequency applications, e.g., 20-25 GHz. Air-cavity FN packages include a plastic-molded body (open, and not sealed) and a lid, which can be formed of ceramic or plastic.

Compared to other types of packages, FN packages can advantageously reduce lead inductance, a small sized "near chip scale" footprint, thin profile and low weight. In addition, flat no-leads packages can have perimeter I/O pads to facilitate PCB trace routing, and can have exposed metal die-pad technology to enhance thermal and electrical performance. These and other features of flat no-leads packages enable their applications in many technologies where small size and weight are desired, as well as high thermal and electrical performance.

Packages Formed by Co-Firing a Ceramic Substrate and a Base Metal Layer

In some applications, it may be desirable to protect the ICs from the ambience, e.g., by forming a hermetic enclosure for the ICs in addition to providing desirable electrical, mechanical and thermal properties. To address these and other needs, in some embodiments, the ceramic packages 100A, 100B (FIGS. 1A-1D) are formed using a high temperature co-firing process. As described herein, a high temperature co-firing process refers to a process of fabricating a ceramic package in which a "green" structure including a ceramic support structure, e.g., the ceramic substrate 104 (FIGS. 1A-1D), and other conductive, resistive and/or dielectric components formed of, e.g., the base metal layer 134 (FIGS. 1C, 1D), are cofired or sintered in a kiln at the same time. That is, instead of first forming a sintered ceramic support structure and subsequently forming other conductive, resistive and/or dielectric components, in these embodiments, a "green" structure formed of a mixture of organic compounds and unsintered ceramic compounds, as well as unsintered base metal structures, is cofired into their final form at the same time. The resulting high temperature co-fired ceramic (HTCC) package, according to embodiments, can provide protection of ICs from various undesirable environmental effects such as moisture, heat, thermal shock, thermal expansion, and corrosion, to name a few. The ceramic package 100A/100B that includes the stack 136 of metallization layers formed on the base metal layer 134 (FIGS. 1C and 1D) as part of the metallization structures 130, 140 (FIGS. 1C and 1D) mitigate various problems recognized in the relevant industry, including degradation associated with diffusion or cross-diffusion of elements between different regions or layers of the metallization structures 130, 140.

Figure 2A:
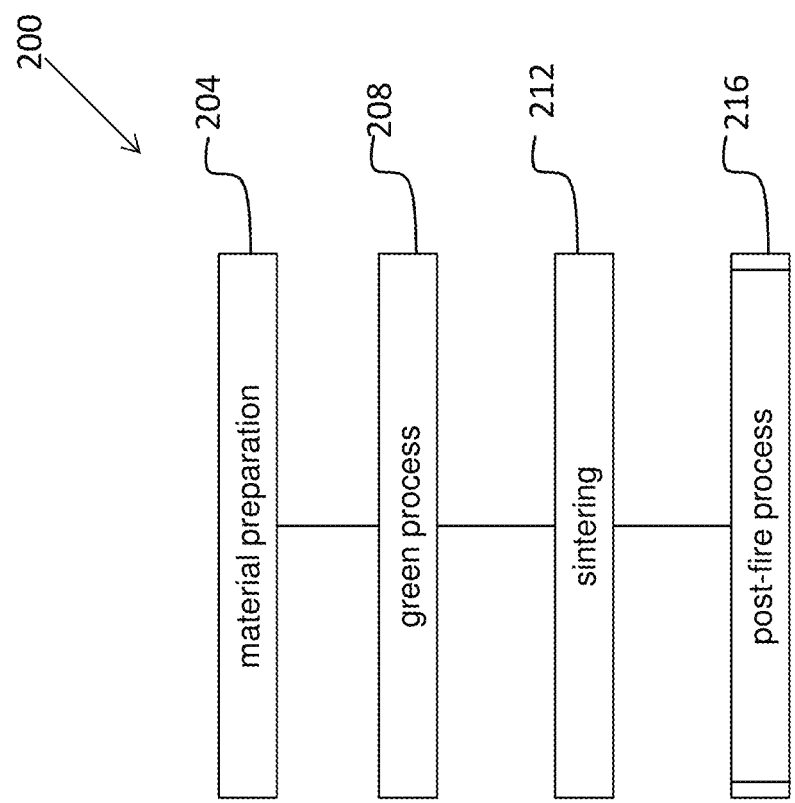
FIG. 2A illustrates a method of fabricating ceramic packages including selectively metallizing, according to embodiments.

FIG. 2 illustrates a method 200 of fabricating ceramic packages, e.g., the ceramic packages 100A, 100B (FIGS. 1A-1D), where the method 200 includes selectively metallizing, according to embodiments. In particular, the method 200 of fabricating includes a material preparation process 204, a green process 208, a sintering process 212, and a post-fire process 216.

The material preparation process 204 includes preparing raw materials for the ceramic substrate 104, including a slurry or a paste formed of ceramic powder, organic solvents and a binder that is cast into a sheet and cut into a ceramic "green" tape. According to various embodiments, the ceramic powder includes a suitable material for forming a ceramic substrate 104. In some embodiments, the ceramic substrate 104 is formed of an aluminum-based material, such aluminum oxide (e.g., $Al_2O_3$) and/or aluminum nitride (AlN). However, embodiments are not so limited, and the ceramic substrate 104 can be formed of other materials, e.g., BeO, silicon carbide (SiC), silicon nitride ($Si_3N_4$), low temperature co-fired ceramic (LTCC) substrates, silicon dioxide ($SiO_2$), zirconia ($ZrO_2$) and ferrites, to name a few. The material preparation process 204 additionally includes preparing a conductive metal ink/paste. According to embodiments, the conductive metal ink/paste includes a refractory metal powder, e.g., tungsten (W) and/or molybdenum (Mo) powder, organic solvents and a binder.

The green process 208 includes punching to form cavities or hollow vias through the ceramic "green tape." The green process 208 additionally includes at least partially filling or lining the cavities or hollow vias with the conductive metal ink or the conductive metal paste comprising the refractory metal power by a suitable process, e.g., screen printing. The green process 208 additionally includes forming, e.g., by screen printing, circuit patterns using the conductive metal ink/paste. In some embodiments, e.g., where the ceramic package includes multiple ceramic layers as illustrated in FIG. 1B, the green process 208 further includes laminating by stacking and compacting multiple "green tape" layers into a monolithic structure in which metallization structures formed at different vertical levels are monolithically interconnected.

Subsequent to the green process 208, the ceramic/refractory metal composite is sintered or "co-fired" at the sintering process 212 in a controlled atmosphere and temperature. The controlled atmosphere can include, e.g., hydrogen or a hydrogen-nitrogen mixture, e.g., forming gas. The controlled temperature can be in a range, e.g., 1200° C.-1900° C., 1400° C.-1700° C., 1500° C.-1650° C. or any range defined by these values that is sufficient to sinter ceramic and metal powders of the "green tape" having formed thereon printed conductive ink/paste structures. The controlled temperature can depend on the ceramic material. For example, for some AlN-based materials, the controlled temperature may be in a range of, e.g, 1650° C.-1900° C., and for some $Al_2O_3$-based materials, the controlled temperature may be in a range of, e.g., 1300° C.-1650° C. During sintering, solvents and other organics in in the conductive metal ink or paste evaporate, thereby forming the base metal layers 134 (FIGS. 1C, 1D). In addition, during sintering, the ceramic powder coalesces to form grains of the ceramic substrate 104.

Figure 2B:
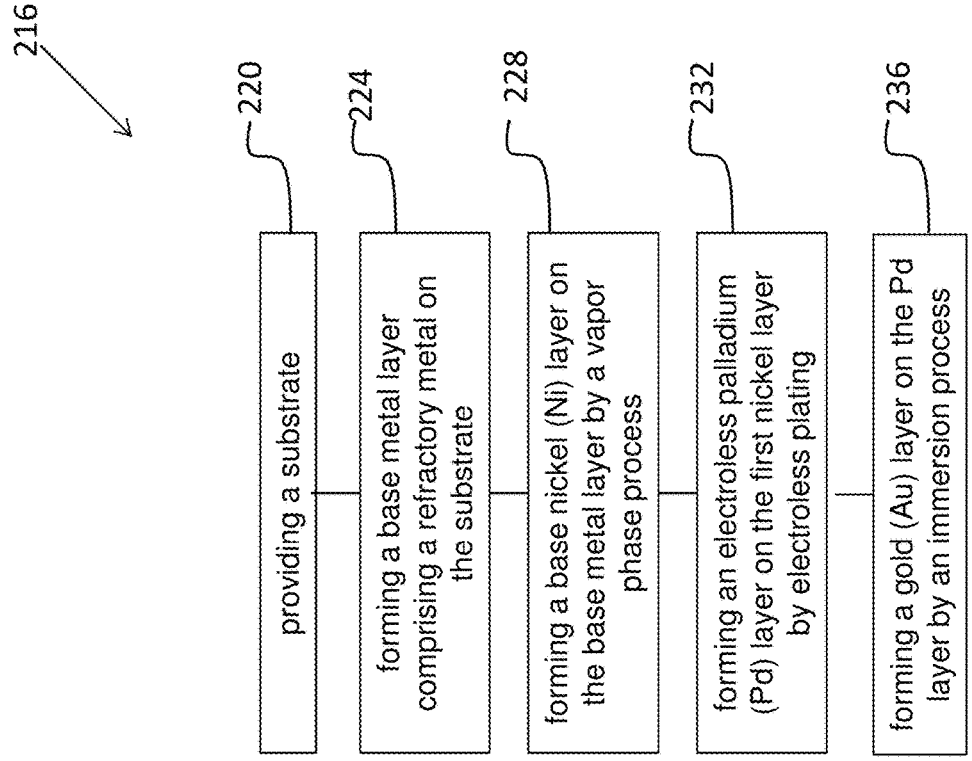
FIG. 2B illustrates a method of selectively metallizing a substrate, according to embodiments.

Subsequent to the sintering process 212, the ceramic/metal composite is post-fire processed at the post-fire process 216, which can include metallization, sawing, machining and brazing. Metallization includes forming a stack 136 (FIGS. 1C, 1D) of metallization layers on the base metal layer 134 (FIGS. 1C, 1D). In some embodiments, the post-fire process 216 includes, as illustrated in FIG. 2B, providing 200 a substrate, e.g., a co-fired ceramic/refractory metal composite, forming 224 a base metal layer comprising a refractory metal on the substrate, forming 228 a base nickel (Ni) layer on the base metal layer by a vapor phase process, forming 232 a palladium (Pd) layer on the first nickel layer by electroless plating, and forming a gold (Au) layer on the Pd layer by an immersion process. The post-fire process 216 is described in further detail below. Forming the stack 136 of metallization layers 136 (FIGS. 1C, 1D) on the base metal layer 134 (FIGS. 1C, 1D) completes the formation of the metallization structures 130, 140 (FIGS. 1C, 1D), including inner thermal/electrical pad 112/124, the outer thermal/electrical pad 116/128 and the via 120/132.

Selective Formation of Metallization Structures on Refractory Metal Surfaces

As described above, according to embodiments, various metallization structures 130, 140 (FIGS. 1C, 1D) include a stack 136 of metallization layers formed on a base metal layer 134. In the following, a detailed description of forming the base metal layer 134 and selectively forming the stack 136 of metallization layers on the base metal layer 134 is provided, whose benefits include, e.g., improved adhesion of the stack 136 of metallization layers to the base metal layer 134, improved planarity of the stack 136 of metallization layers, reduced corrosion of the layers of the stack 136 of metallization layer (e.g., in the Ni layer), reduced electrical shorts from the selective formation of the stack 136 of metallization layers on the base metal layer 134 against adjacent ceramic surfaces, and various manufacturing advantages, to name a few.

FIGS. 3A-3F illustrate intermediate structures at various stages of fabricating the ceramic package 100A/100B illustrated with respect to FIGS. 1A-1D, e.g., based on the processes illustrated with respect to FIG. 2B, according to embodiments. In each of FIGS. 3A-3F, portions of the intermediate structures relevant to describing the different layers of metallization structures 130, 140 (FIGS. 1C, 1D) are illustrated for clarity. For example, with respect to FIGS. 1C and 1D, the illustrated portions may represent cross sectional views of the metallization structures 130, 140 taken vertically along the cross sections AA', or horizontally along the cross section BB'.

Figure 3A:
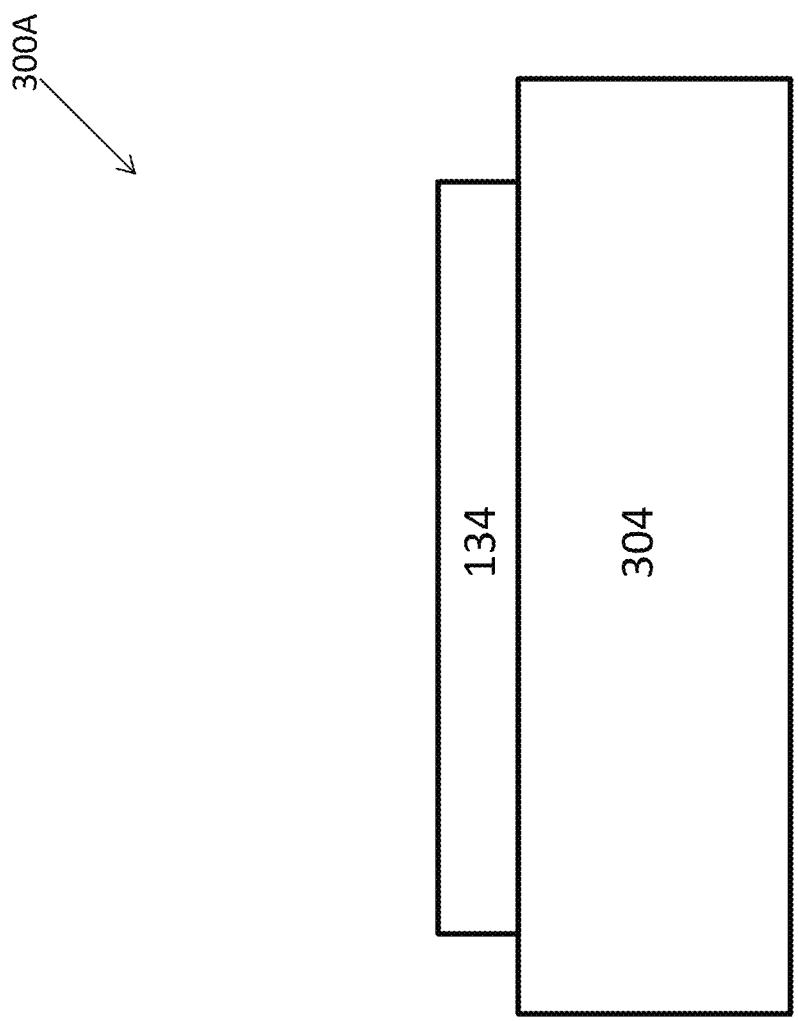
FIGS. 3A-3F illustrate intermediate structures at various stages of fabricating a ceramic package, including selectively metallizing, according to embodiments.

Referring to FIG. 3A, the intermediate structure 300A after forming the base metal layer 224 (FIG. 2B) comprises a substrate 304, e.g., a ceramic substrate. In some embodiments, the intermediate structure 300A represents a "green" structure prior to being fired or cofired, as described supra with respect to FIG. 2A. In these embodiments, the substrate 304 may be formed of a mixture of ceramic powder, organic solvents and a binder that is cast into a sheet and cut into a ceramic "green" tape, and subsequently punched to form cavities or vias, in a similar manner as described above with respect to the green process 208 (FIG. 2). For example, the ceramic "green" tape may comprise a ceramic powder that is adapted forming, after being sintered, an aluminum-based ceramic substrate 104 (FIGS. 1A-1D), such as aluminum oxide (e.g., $Al_2O_3$) and/or aluminum nitride (AlN). In some embodiments, the ceramic "green" tape may further comprise silica-based glass powder, e.g., about 4%-10% on the basis of a combined weight of aluminum oxide and/or aluminum nitride powder and the glass powder. However, embodiments are not so limited and in other embodiments, the substrate 304 may represent a pre-sintered ceramic substrate, e.g., a sintered aluminum oxide (e.g., $Al_2O_3$) substrate and/or a sintered aluminum nitride (AlN) substrate. Still in other embodiments, the substrate 304 may represent other inorganic substrates, e.g., a glass or a glass ceramic substrate, an organic substrate, e.g., the plastic substrate of a PCB or a semiconductor substrate, to name a few, where selective formation of metallization structures may be desired.

Still referring to FIG. 3A, the intermediate structure 300A further comprises a base metal layer 134, comprising a refractory metal, formed on the substrate 304. In embodiments where the intermediate structure 300A represents a "green' structure prior to being fired or cofired, the base metal layer 134 may comprise structures that are formed of, e.g., a conductive metal ink/paste. According to embodiments, the conductive metal ink/paste includes a refractory metal powder, e.g., powder comprising tungsten (W) and/or molybdenum (Mo), organic solvents and a binder. In these embodiments, the base metal layer 134 may be formed on surfaces of the "green" ceramic substrates 304 and subsequently cofired, in a similar manner as the green process 208 described above with respect to the method 200 (FIG. 2). However, embodiments are not so limited and in other embodiments, the base metal layer 134 may be an unsintered base metal layer 134 formed on a pre-sintered ceramic substrate 304. In some embodiments, the base metal layer 134 may be deposited using a suitable technique, e.g., by screen printing, and include, e.g., tungsten (W) or molybdenum (Mo) in elemental or in alloy form.

According to embodiments, the base metal layer 134 may have a thickness in a range of 0.1 µm to 100 µm or greater, 1 µm to 100 µm, 1 µm to 25 µm, 25 µm to 50 µm, 50 µm to 75 µm, 75 µm to 100 µm or any range defined by these values.

In embodiments where the intermediate structure 300A of FIG. 3A represents a "green' structure, after forming the base metal layer 134, the intermediate structure 300A, which may have one or more layers of ceramic/metal composite layers, is sintered or "co-fired," according to the sintering process 212 (FIG. 2A) in a controlled atmosphere and temperature. The controlled atmosphere can include, e.g., hydrogen, nitrogen or a hydrogen-nitrogen mixture (e.g., forming gas), or another inert gas such as Ar. The controlled temperature can be in a range, e.g., 1200° C.-1900° C., 1400° C.-1700° C., 1500° C.-1650° C. or any range defined by these values.

Other embodiments are possible for forming the intermediate structure 300A of FIG. 3A. In some other embodiments, a blanket layer of refractory metal (e.g., W or Mo) may be first formed, followed by patterning and etching, e.g., using a photomask, to form the base layer 134.

Furthermore, in alternative embodiments, the base metal layer 134 can be a metal suitable for the cofiring process described herein, which may be a non-refractory metal, including, e.g., Pt, Pd, Cu or Ag.

After cofiring, the intermediate structure 300A proceeds for further processing, including deposition of a stack 136 (FIGS. 1C, 1D) of metallization layers on the exposed areas of the base metal layer 134. Advantageously, because the cofiring of the is performed at a relatively high temperature, the surface of the intermediate structure 300 may be rendered substantially free of undesirable organic or inorganic residues or contaminants. As a result, under some circumstances, a cleaning process that is used in other technologies for removing such residues or contaminants prior to forming additional layers as described below may be omitted.

Figure 3B:
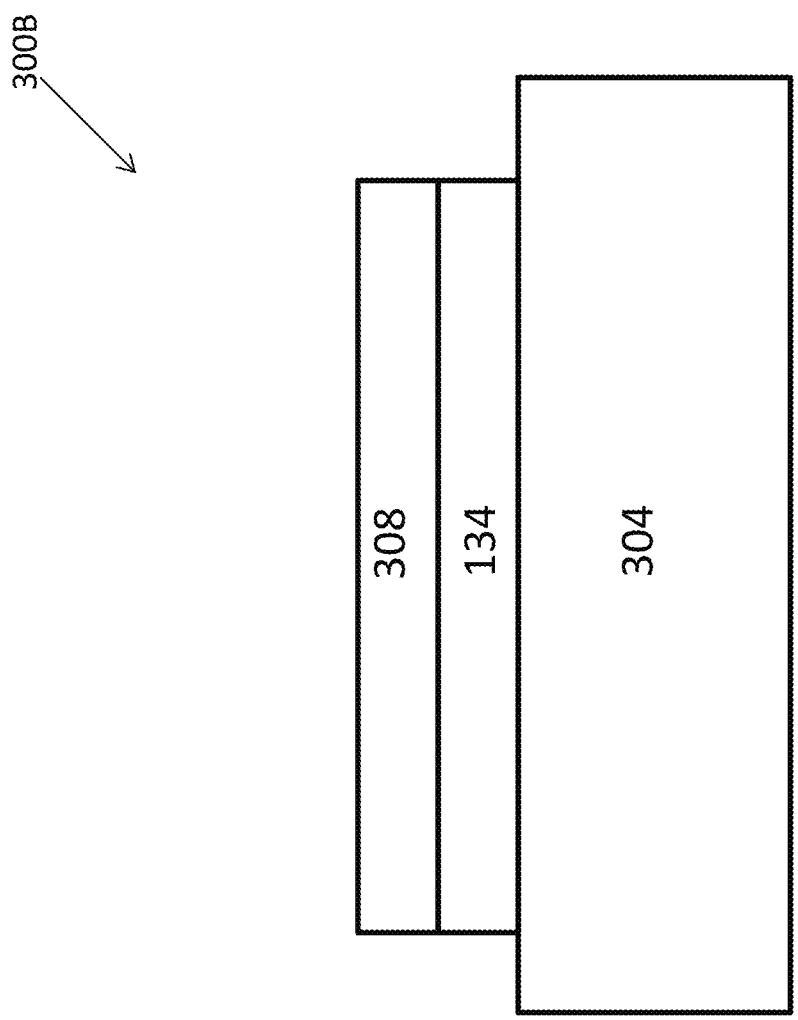

Referring to FIG. 3B, the intermediate structure 300B illustrates a first Ni layer 308 formed on the base metal layer 134 described above with respect to FIG. 3A. According to embodiments, the first Ni layer 308 is formed using a suitable vapor phase process, e.g., chemical vapor deposition (CVD) process. A suitable chemical vapor deposition (CVD) process can be a plasma-based CVD process, such as a plasma-enhanced chemical vapor deposition (PECVD) process, as thermal CVD processes, such as a low pressure chemical vapor deposition (LPCVD) process, sub-atmospheric CVD (SACVD), or atmospheric CVD, among other CVD processes.

As described above, the industry has made a significant effort with very limited success to employ different variations of combining traditional plating processes, e.g., electrolytic plating or electroless Ni plating in conjunction with traditional high temperature co-firing processes to achieve the desired sealing results. For example, forming metallization layers by electroless plating directly on co-fired ceramic substrates have yielded unsatisfactory sealing performance. Surprisingly, the inventors have discovered that forming the first Ni layer 308 using a suitable CVD process prior to forming additional metallization layers by electroless plating produced very satisfactory results. Without being bound to any theory, depositing the first Ni layer 308 on the base metal layer 134 under various conditions described herein may provide a nucleation layer which results in superior characteristics of subsequent metallization layers, e.g., electroless Ni layer and/or electroless Pd layer.

In some embodiments, a suitable CVD process employs a Ni source and an activator source. The Ni source may be a source, e.g., a solid source such as a crucible or an effusion source, that is configured to contain an elemental refractory metal or an alloy containing the elemental refractory metal. The vapor pressure or the partial vapor pressure of Ni may be controlled by heating the solid source to a suitable temperature, e.g., to a suitable temperature in a range, e.g., 400° C.-1300° C., 600° C.-1100° C., 800° C.-900° C. or any range defined by these values, for a period of time in a range, e.g., 1 minute to 120 minutes, 5 minutes to 60 minutes or 5 minutes to 30 minutes or any range defined by these values.

The suitable CVD process additionally employs an activator source. The activator source may be a solid source, e.g., a crucible or an effusion source, that is configured to contain an activator. Without being bound to any theory, an activator is a compound that serves as a catalyst to facilitate deposition of the first Ni layer 308 selectively on particular surfaces, e.g., surfaces having exposed refractory metal elements. According to various embodiments, activators that facilitate selective deposition of Ni on surfaces having exposed W or Mo include iodides. Example iodides that may be employed include ammonium iodide ($NH_4I$), copper iodide (CuI), cobalt iodide ($CoI_2$), iron iodide ($FeI_2$), lead iodide ($PbI_2$), manganese iodide ($MnI_2$), silver iodide (AgI) and vanadium iodide ($VI_2$), to name a few. The vapor pressure or the partial vapor pressure of the activator may be controlled by heating the activator source to a suitable temperature, e.g., to a suitable temperature in a range, e.g., 400° C.-1300° C., 600° C.-1100° C., 800° C.-900° C. or any range defined by these values, for a period of time in a range, e.g., 1 minute to 120 minutes, 5 minutes to 60 minutes or 5 minutes to 30 minutes or any range defined by these values.

During or after the deposition of the first Ni layer 308, the intermediate structure 300A may be heated to a suitable temperature, e.g., to a temperature similar or different than that of the refractory metal source and/or the activator source. The intermediate structure 300A may be heated to a suitable temperature in a range, e.g., to a suitable temperature in a range, e.g., 400° C.-1300° C., 600° C.-1100° C., 800° C.-900° C. or any range defined by these values, for a period of time in a range, e.g., 1 minute to 120 minutes, 5 minutes to 60 minutes or 5 minutes to 30 minutes or any range defined by these values.

In various embodiments, the temperatures of the refractory metal source, the activator source and the intermediate structure 300A may be controlled independently or together. In addition, the CVD may be performed under a suitable atmosphere including, e.g., hydrogen, nitrogen or a hydrogen-nitrogen mixture, or other inert gases such as Ar.

To illustrate, by way of example, without being bound to any theory, when ammonium iodide is employed as the activator, the deposition of the first Ni layer 308 on the base metal layer 134 comprising a refractory metal (e.g., W, Mo) may proceed as follows. During the deposition of the first Ni layer 308, ammonium iodide may decompose into one or more of ammonia, hydrogen iodide (HI), nitrogen and hydrogen. HI may react with Ni to form nickel iodide ($NiI_2$). At a higher temperature, $NiI_2$ vaporizes, is transported to the exposed surfaces of the base metal layer 134 and deposit as Ni. The deposition of the first Ni layer 308 may be caused by, e.g., one or more of the following reactions when the refractory metal comprises W:

$$NiI_2 + W \rightarrow Ni + WI_n \quad [1]$$

$$NiI_2 + H_2 \rightarrow Ni + HI \quad [2]$$

$$NiI_2 \rightarrow Ni + I_2/I \quad [3]$$

On the other hand, when the refractory metal comprises Mo, the deposition of the first Ni layer 308 may be caused by, e.g., one or more of reactions [2] and [3] and a reaction according to:

$$NiI_2 + Mo \rightarrow Ni + MoI_n \quad [4]$$

Without being bound to any theory, one or more of the exchange reactions of Ni with W or Mo according to reactions [1] or [4], the hydrogen reduction reaction according to reaction [2] and the thermal decomposition reaction according to reaction [3] can cause Ni to be selectively formed on the base metal layer 134 against adjacent surfaces of the substrate 304. The reactions [2] and [3] may be catalyzed by the refractory metal elements W or Mo, which causes the selectivity of the deposition.

Other embodiments are possible for depositing the first Ni layer 308 on the base metal layer 134. In some embodiments, instead of depositing the first Ni layer 308 by CVD using a refractory metal source and an activator source as described above, the first Ni layer 308 may be formed by an evaporation method. For example, in some embodiments, $NiI_2$ can be directly evaporated onto the surfaces of the base metal layer 134 from a solid source, e.g., a crucible or an effusion source, having solid $NiI_2$ that is heated to or above the melting point of $NiI_2$, which is about 797° C. Without being bound to any theory, on the basis of the reactions [1]/[4], [2] and/or [3], the first Ni layer 308 forms selectively on the surfaces of the base metal layer 134.

Advantageously, the first Ni layer 308 formed according to a vapor phase process described herein can be substantially free of undesirable contaminants that may result when the Ni layer 308 is formed using other methods. For example, some Ni layers deposited by a plating process incorporate B and/or P, e.g., due to processes that activate the surface prior to depositing the Ni layers. Because the composition of the first Ni layer 308 formed using vapor phase processes described herein can be controlled using the reactants or the precursors, the resulting first Ni layer 308 can advantageously be substantially free of P or B, or contain P or B at a concentration less than 1%, less than 0.5%, less than 0.2%, less than 0.1%, less than 0.05%, less than 0.02%, less than 0.01%, less than 0.005%, less than 0.002%, less than 0.001%, or at a concentration within any range defined by these values on the basis of the total weight of the first Ni layer 308.

Figure 3C:
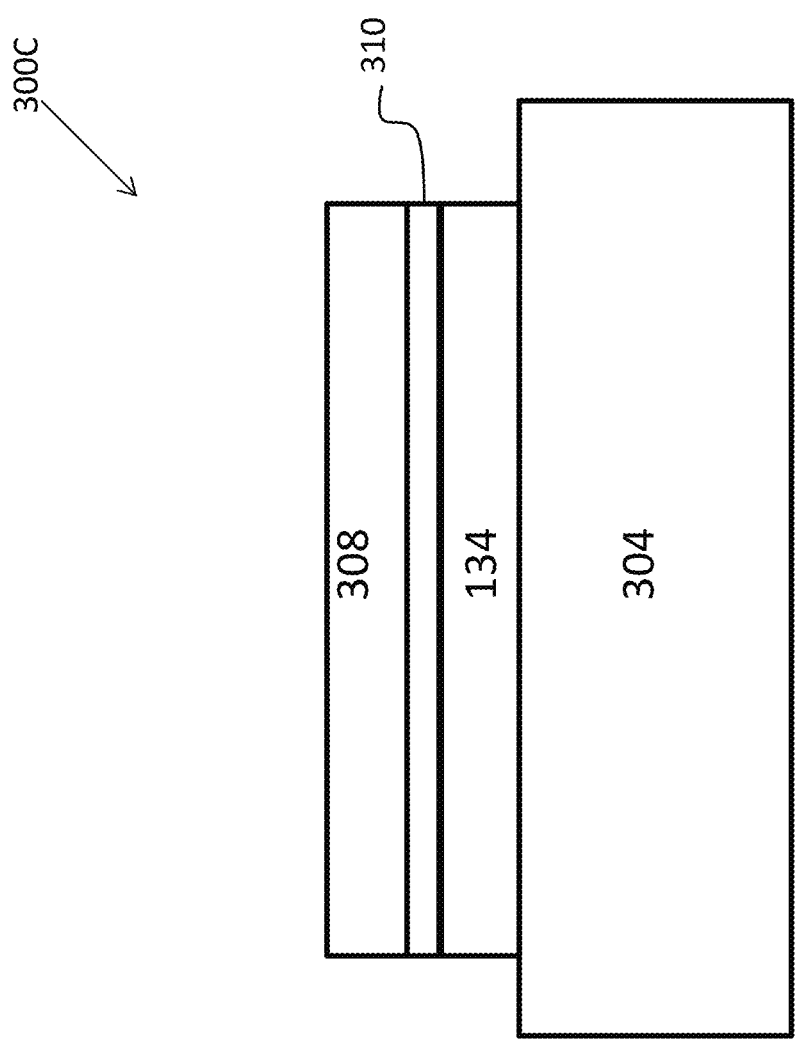

Referring to FIG. 3C, the intermediate structure 300C illustrates formation of an interfacial layer 310 interposed between the base metal layer 134 and the first Ni layer 308, according to embodiments. In some embodiments, the first Ni layer 308 is deposited at a temperature that is sufficiently high and for a sufficient duration such that the interface between first Ni layer 308 and the base metal layer 134 undergoes an in-situ annealing effect, which results in formation of an interfacial layer 310 comprising the refractory metal element of the base metal layer 134 and Ni of the first Ni layer 308. In some other embodiments, the interface between the first Ni layer 308 and the base metal layer 134 is subsequently annealed at a temperature that is sufficiently high and for a sufficient duration, such that the interfacial layer 310 is formed. A sufficient temperature range for the formation of the interfacial layer 310 may be, e.g., 400° C.-1400° C., 700° C.-1200° C., 400° C.-600° C., 600° C.-800° C., 800° C.-1000° C., 1000° C.-1200° C., 1200° C.-1400° C., or any range defined by these values. A sufficient duration for the formation of the interfacial layer 310 may be, e.g., e.g., 1 minute to 120 minutes, 5 minutes to 60 minutes or 5 minutes to 30 minutes, or any range defined by these values. According to embodiments, the interfacial layer 310 has a thickness in a range of, e.g., 1 nm-10 nm, 10 nm-50 nm, 50 nm-100 nm, or any range defined by any of these values.

Figure 4:
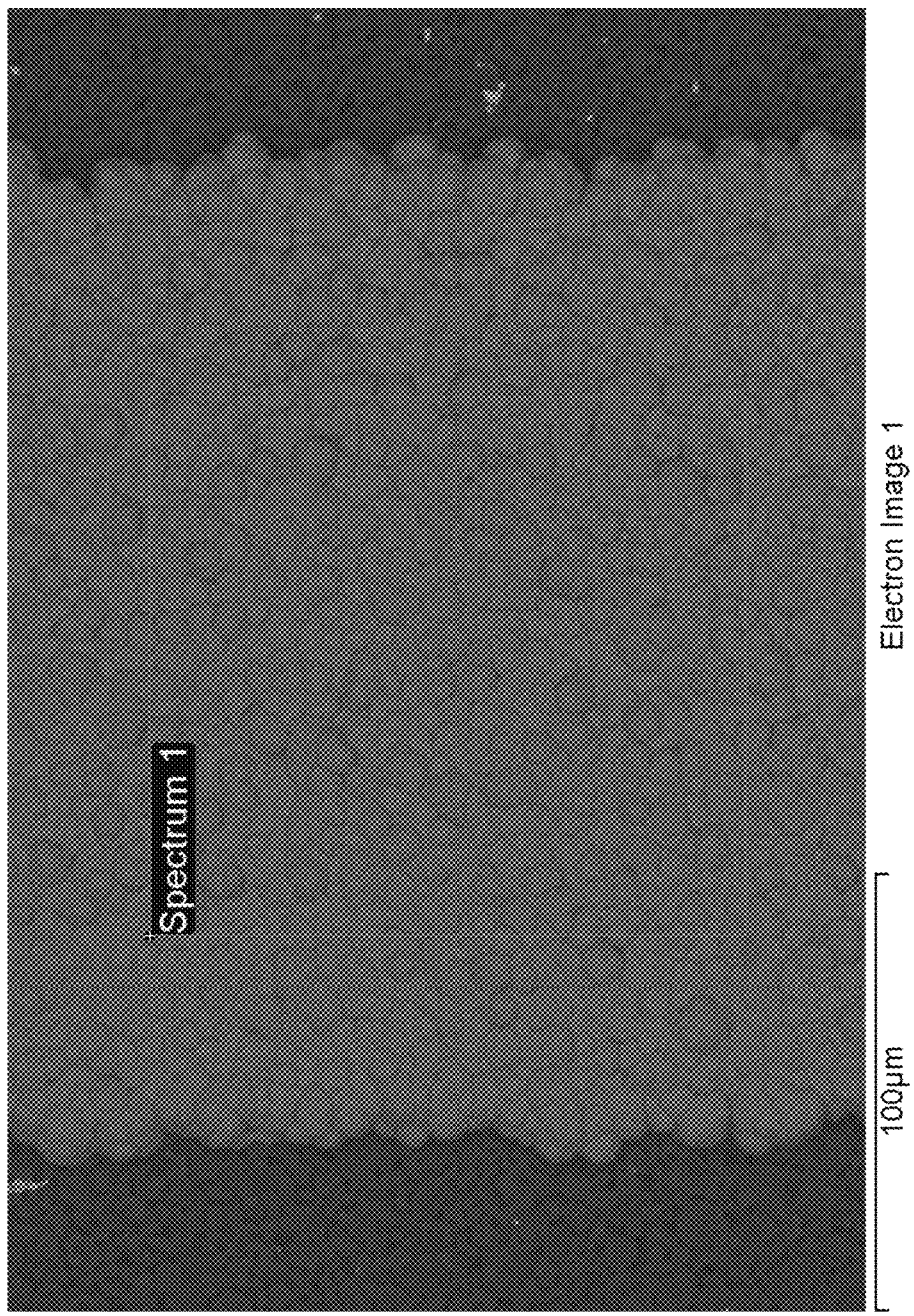
FIG. 4 is a plan-view scanning electron micrograph of a nickel layer formed by chemical vapor deposition, according to embodiments.

The inventors have found that, as formed at the temperature range described above, the first Ni layer 310 has a microstructure as shown in the scanning electron micrograph (SEM) image shown in FIG. 4. The inventors have found that the characteristics of subsequent layers (e.g., second Ni layer 312) can be optimum when the first Ni layer 310 has an average grain size in the range of about 1 μm to 5 μm, as shown in the SEM image of FIG. 4. A chemical analysis of the SEM image, e.g., using energy dispersive X-ray spectroscopy (EDS), revealed that the nickel layer as deposited is substantially free of other elements, or below detection limit of EDS.

In some embodiments where the base metal layer 134 comprises W, the interfacial layer 310 comprises a W phase having a body-centered cubic (BCC) crystal structure, and having incorporated therein Ni at a concentration less than about 15%, 10%, 5%, 2%, 1%, 0.5%, 0.2%, 0.1% or at a concentration within any range defined by these values. In some other embodiments, the interfacial layer 310 comprises a Ni phase having a face-centered cubic (FCC) crystal structure, and having incorporated therein W at a concentration less than about 30%, 20%, 10%, 5%, 2%, 1%, 0.5%, 0.2%, 0.1% or at a concentration within any range defined by these values. In yet some other embodiments, the interfacial layer 310 comprises an intermetallic phase, e.g., $Ni_4W$, $NiW$, or $NiW_2$.

In some embodiments where the base metal layer 134 comprises molybdenum (Mo), the interfacial layer 310 comprises a Mo phase having a body-centered cubic (BCC) crystal structure, and having incorporated therein Ni at a concentration less than about 15%, 10%, 5%, 2%, 1%, 0.5%, 0.2%, 0.1% or at a concentration within any range defined by these values. In some other embodiments, the interfacial layer 310 comprises a nickel phase having a face-centered cubic (FCC) crystal structure, and having incorporated therein Mo at a concentration less than about 30%, 20%, 10%, 5%, 2%, 1%, 0.5%, 0.2%, 0.1% or at a concentration within any range defined by these values. In yet some other embodiments, the interfacial layer 310 comprises an intermetallic phase, e.g., $Ni_4Mo$, $Ni_3Mo$, or $NiMo$.

The inventors have found that the interfacial layer 310 having a combination the thickness, crystal structure, and concentrations of Ni and W or Ni and Mo as described herein advantageously improves the adhesion strength between the base metal layer 134 and the first Ni layer 308, compared to a structure in which the interfacial layer 310 is omitted or the interfacial layer 310 has a thickness and/or a concentration outside of the ranges described herein, by more than 10%, more than 20%, more than 50%, or more than 100%, or by a percentage in a range defined by any of these values.

In addition, the inventors have found that the interfacial layer 310 having a combination the thickness, crystal structure, and concentrations of Ni and W or Ni and Mo as described herein advantageously reduces the electrical resistance across the base metal layer 134 and the first Ni layer 308, compared to a structure in which the interfacial layer 310 is omitted or the interfacial layer 310 has a thickness and/or a concentration outside of the ranges described herein, by more than 10%, more than 20%, more than 50%, or more than 100%, or in a range defined by any of these values.

Figure 3D:
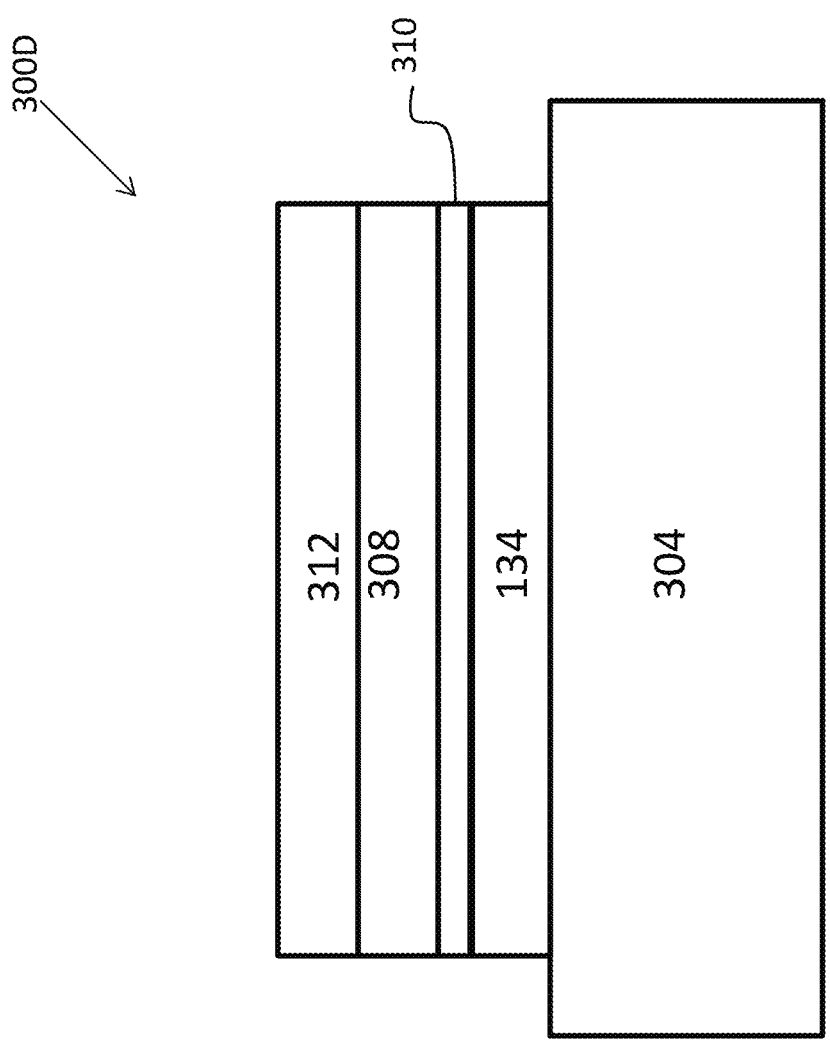

Referring to an intermediate structure 300D illustrated in FIG. 3D, subsequent to the deposition of the first Ni layer 308, a second Ni layer 312 is formed on the first Ni layer 308. According to embodiments, the second Ni layer 312 is formed using a electroless plating process.

As described herein, an electroless plating process, as distinguishable from an electrolytic process, refers to a solution-based plating process in which a sustained deposition of a metal or a metal alloy occurs on a target surface through an oxidation-reduction chemical reaction, without the application of an external electrical potential to the target surface. Reducing agents, e.g., sodium hypophosphite ($NaPO_2H_2$) or sodium formate (HCOONa), react at catalytic surfaces (e.g., base metal layer) to release electrons, reduce the positively charged metal ions (e.g., Ni ions), thereby promoting deposition of the metal (e.g., Ni) or the metal (e.g., Ni) alloy on the target metal (e.g., base metal layer) surface. Electroless plating processes are sometimes described as being autocatalytic, because the deposition process continues even after the target surface is completely covered by a continuous layer of the plated metal or the metal alloy. The thickness will therefore continue to increase in the presence of source metal ions and a reducing agent, until the depositing surface is removed from the plating bath. The physical characteristics including the thickness of plated metal or metal alloy depend, among other things, the bath temperature, chemical parameters (such as solution pH) and the amount of time spent in the plating bath.

Electroless plating of Ni, e.g., for metallizing PCBs, is sometimes preceded by a surface treatment, sometimes referred to as an activation process, which catalyzes the plating process. For example, in some electroless Ni plating processes, e.g., electroless Ni plating on a copper (Cu) surface, the Cu surface can be activated or catalyzed using, e.g., a palladium (Pd)-containing solution. As described herein, activating or catalyzing refers to a process in which the rate of a chemical reaction is accelerated by a catalyst, which is a substance that increases the rate of the chemical reaction without itself undergoing any permanent chemical change. For example, a displacement reaction can generate a thin layer of Pd on the copper surface, which can serve as a catalytic surface for electroless Ni plating. For example, $PdSO_4$ and/or $PdCl_2$ may be used as activator, in which a displacement reaction forms a thin layer of Pd, which serves to catalyze the electroless plating of a Ni layer on the Cu surface. Advantageously, in embodiments described above, where the first Ni layer 308 is formed by CVD or evaporation, such an activation process, e.g., using a Pd-based activator, may not be needed. That is, because the starting surface comprises a Ni surface, the intermediate structure 300D can be placed directly into a Ni-plating bath to form second Ni layer 312, without an intervening catalyzing step.

Advantageously, because the deposition of the first Ni layer 308 is performed at a relatively high temperature, the surface of the first Ni layer 308 may be rendered substantially free of organic material. As a result, under some circumstances, a cleaning process that is used in other technologies for removing organic material prior to Ni plating may not be employed immediately prior to electroplating the second Ni layer 312.

Thus, according to embodiments, the second Ni layer 312 is formed without forming a catalyzing Pd layer between the Ni layer and the substrate, and therefore, the intermediate structure 300D may be substantially free of Pd between the second Ni layer 312 and the substrate 304, e.g., less than 10%, less than 5% or less than 1% by volume.

The electroless plating of the second Ni layer 312 thus proceeds on the surface of the first Ni layer 308 in a Ni-plating bath without formation of a Pd layer therebetween. Without being bound to any theory, in one example, electroless plating of Ni proceeds in a bath containing $NaPO_2H_2$ in which one or more of the following reactions may occur:

$$H_2PO_2^- + H_2O \rightarrow H^+ + HPO_3^{2-} + 2H \quad [5]$$

$$Ni^{2+} + 2H \rightarrow Ni\downarrow + 2H^+ \quad [6]$$

$$H_2PO^{2-} + H \rightarrow P\downarrow + OH^- + H_2O \quad [7]$$

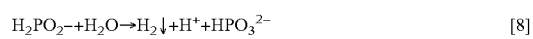

$$H_2PO_2^- + H_2O \rightarrow H_2\downarrow + H^+ + HPO_3^{2-} \quad [8]$$

It will be appreciated that atomic hydrogen produced in the hydrolysis reaction [5] causes formation of elementary Ni from $Ni^{2+}$ according to the reaction [6], while causing formation of elementary P from $H_2PO^{2-}$ according to the reaction [7]. As a result, the second Ni layer 312 incorporates elementary P at a concentration greater than the concentration of P in the first Ni layer, e.g., greater than 5%, greater than 2%, greater than 1%, greater than 0.5%, greater than 0.2%, greater than 0.1%, or at a concentration within any range defined by these values on the basis of the total weight of the second Ni layer 308. In addition, because the first Ni layer 308 can be substantially free or P, the combination of the first and second Ni layers 308, 312 has elementary P at an intermediate concentration between that of the first and second Ni layers 308, 312, e.g., less than 5%, less than 2%, less than 1%, less than 0.5%, less than 0.2%, less than 0.1%, or at a concentration within any range defined by these values on the basis of the total weight of the combined first and second Ni layers 308, 312.

Inventors have found that, in addition to the various advantages of depositing the first Ni layer 308 on the base metal layer 134 using a vapor phase reaction as described above, including the selectivity of the deposition of the first Ni layer 308 on the base metal layer 134, a lower overall P content in the first and second Ni layers 308, 312, and a lack of a need for catalyzing or cleaning the surface on which the second Ni layer 312 is electrolessly plated, further forming the second Ni layer 312 by electroless plating results in various synergistic improvements, including a high degree of planarity of the combined first and second Ni layers 308, 312. Depending on the implementation, the degree of non-uniformity, as measured on the basis of percentage over an area comparable to the area of the substrate 304, can be, e.g., less than 10%, less than 5%, less than 1%, less than 0.5%, or within any range defined by these values, according to embodiments. The high degree of planarity has been observed when the ratio of thicknesses between the first Ni layer 308 and the second Ni layer 312 is, e.g., 0.1 to 0.2, 0.2 to 0.5, 0.5 to 1, 1 to 3, 3 to 5, 5 to 10, or within any range defined by these values. Inventors have found that the improvement in planarity can surprisingly improve the hermetic sealing performance as well as visual appearance of ceramic products and packages fabricated using a co-firing process described above with respect to FIG. 2A.

According to embodiments, the combined thickness of the first and second Ni layers 308, 312 is about 1 μm-100 μm, 1 μm-50 μm, 1 μm-20 μm, 1 μm-10 μm, 2.5 μm-6.5 μm, or in a range defined by any of these values.

Figure 3E:
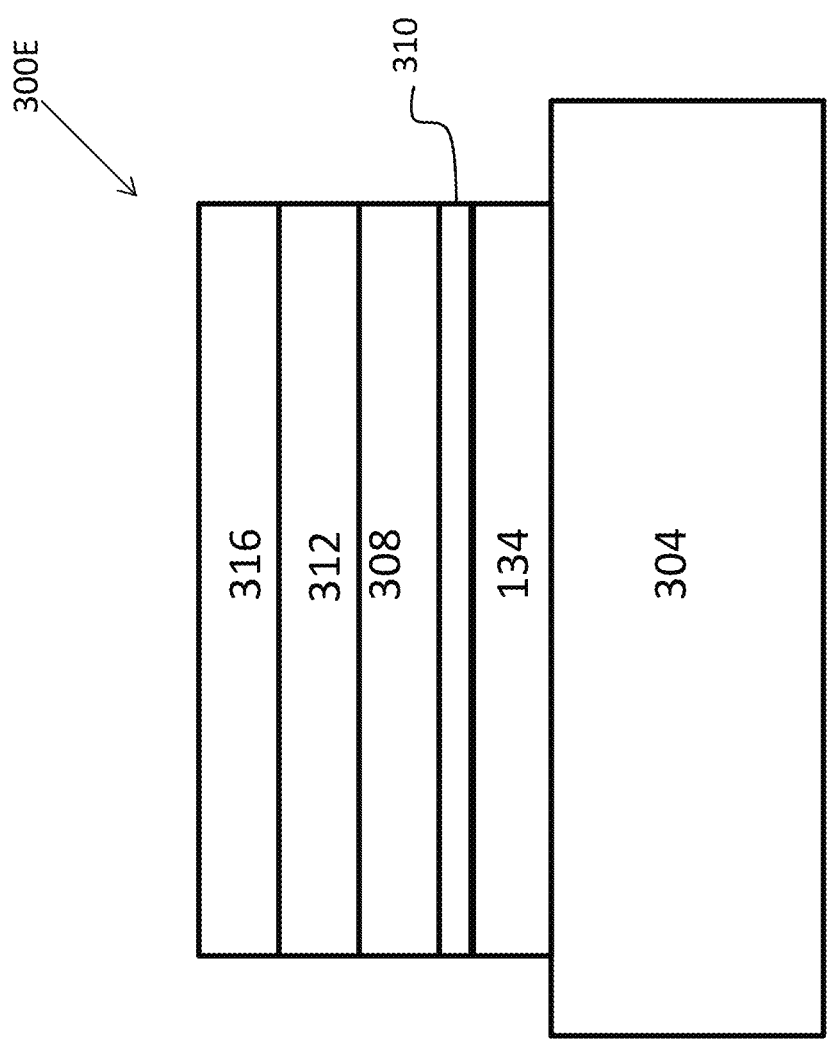
Figure 3F:
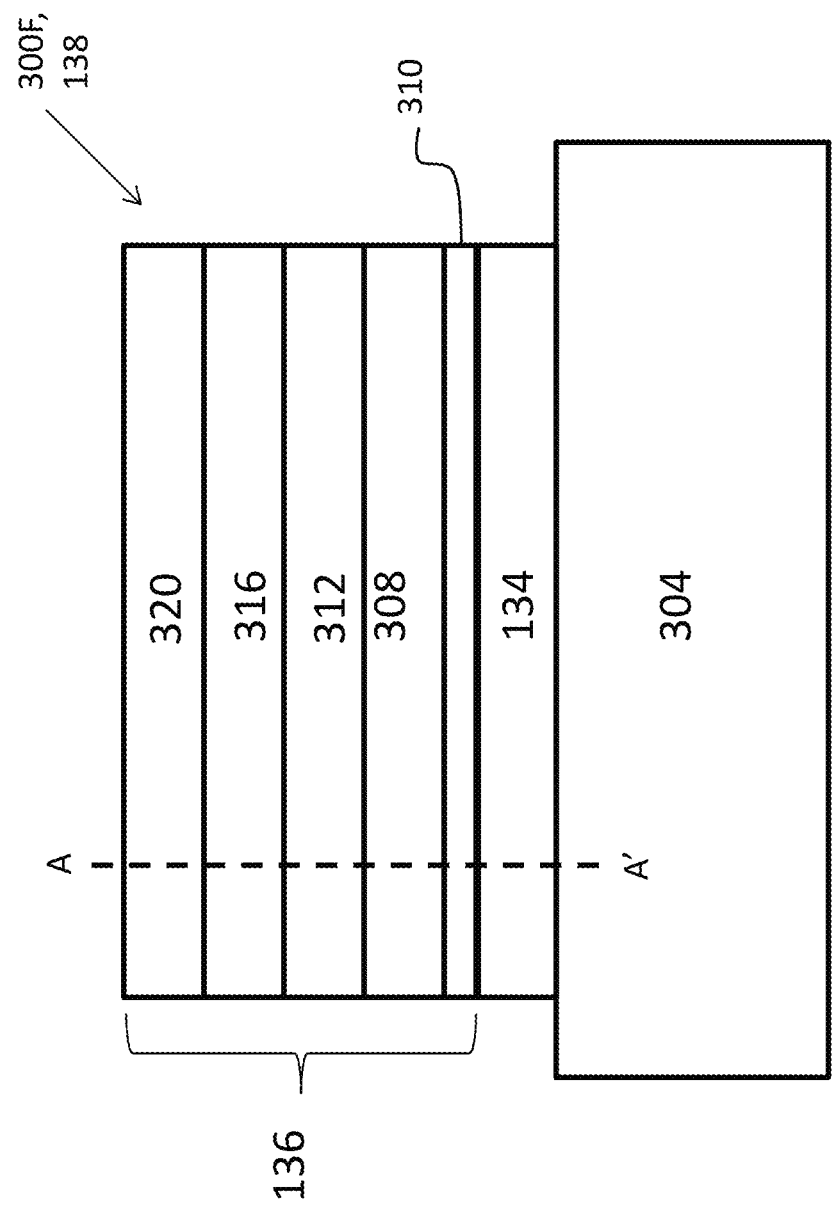

In addition to various advantages described above, the first and/or second Ni layers 308, 312 additionally serve as a barrier to inter-diffusion of the refractory metal in the base metal layer 134 and gold (Au) in a subsequently deposited Au layer 320 (FIG. 3F).

Referring to an intermediate structure 300E illustrated in FIG. 3E, subsequent to plating the second Ni layer 312 on the first Ni layer 308, a Pd layer 316 is formed on the second Ni layer 312. According to embodiments, the Pd layer 316 is formed using a electroless plating process.

Under some circumstances, the Pd layer 316 serves, among other things, as a diffusion barrier layer that reduces or essentially eliminates corrosion of the first and/or second Ni layers 308, 312, which can result from diffusion of the elements of the solution used in the deposition of Au layer 320.

The Pd layer 316 may additionally serve as a barrier to reduce or essentially eliminate diffusion of Ni from the first and/or second Ni layers 308, 312 into the Au layer 320 (FIG. 3F). As a result, the presence of Pd layer 316 improves bondability of the surface of the Au layer 320 (FIG. 3F) because it has been found that, under some circumstances, over time, Ni can diffuse into and through the Au layer 320, e.g., through the crystal boundaries, causing a wirebond wire attached to the Au layer 320 can fail to adequately stick to the Au layer 320. In addition, because presence of the Pd layer 316 allows the Au layer 320 to remain relatively Ni free, the Au layer 320 can be wirebonded on a Au layer 320 having a relatively low thickness, thereby lowering cost.

Furthermore, the Pd layer 316 may serve as an anti-oxidation layer and/or an anti-corrosion layer which improves solderability. Similar to electroless plating of the second Ni layer 312, electroless plating of Pd may proceed on the surface of the second Ni layer 312 in a Pd-plating bath. Without being bound to any theory, in one example, electroless plating of Ni can be performed using a bath containing $NaPO_2H_2$ in which one or more of the following reactions may occur:

$$H_2PO_2^- + H_2O \rightarrow H^+ + HPO_3^{2-} + 2H \quad [9]$$

$$Pd^{2+} + 2H \rightarrow Pd\downarrow + 2H^+ \quad [10]$$

$$H_2PO_2^- + H \rightarrow P\downarrow + OH^- + H_2O \quad [11]$$

$$H_2PO_2^- + H_2O \rightarrow H_2\downarrow + H^+ + HPO_3^{2-} \quad [12]$$

For similar reasons as described above with respect to electroless plating the second Ni layer 312, the atomic hydrogen produced in the hydrolysis reaction [9] causes formation of elementary Pd from $Pd^{2+}$ according to the reaction [10], while causing formation of elementary P from $H_2PO^{2-}$ according to the reaction [11]. As a result, the Pd layer 316 incorporates elementary P at a concentration, e.g., greater than 5%, greater than 2%, greater than 1%, greater than 0.5%, greater than 0.2%, greater than 0.1%, or at a concentration within any range defined by these values on the basis of the total weight of the Pd layer 316.

According to embodiments, the thickness of the Pd layer 316 is about 0.05 μm-6 μm, 0.05 μm-1 μm, 0.05 μm-0.5 μm, 0.05 μm-0.2 μm, 0.05 μm-0.1 μm, or in a range defined by any of these values.

Referring to an intermediate structure 300F illustrated in FIG. 3F, subsequent to plating the Pd layer 308 on the second Ni layer 312, a Au layer 320 is formed on the Pd layer 316. According to embodiments, the Au layer 320 is formed using an immersion process.

As described herein, an immersion process refers to a solution-based chemical process in which a chemical displacement reaction occurs to deposit a layer of metal, e.g., Au, onto a base metal, e.g., Pd. In an immersion reaction, the base metal dissolves, releasing the electrons that reduce the positively charged ions of the metal present in a solution. Driven by an electrochemical potential difference, the metal ions in solution (e.g., Au ions) are deposited onto the surface of the base metal, while displacing ions of the base metal into the solution. The reaction can continue as long as the base metal is available to supply electrons for the displacement reaction, which can occur according to one or more of the following reactions:

$$Pd^0 Pd^{++} + 2e^- \quad [13]$$

$$2Au^+ + 2e^- \rightarrow 2Au^0\downarrow \quad [14]$$

$$2Au^+ + 2e^- \rightarrow 2Au^0\downarrow + Pd^{++} \quad [15]$$

It will be appreciated that, while an immersion process has been described for forming the Au layer 320, embodiments are not so limited, and in other embodiments, the Au layer 320 can be formed using other processes such as electro and electroless plating processes and deposition processes.

The Au layer 320 provides various advantages, including oxidation resistance, low resistivity and protection of the underlying Pd layer 316 from reacting with the ambient environment, among other advantages.

According to embodiments, the thickness of the Au layer 320 is about 0.05 μm-10 μm, 0.05 μm-1 μm, 0.05 μm-0.5 μm, 0.05 μm-0.2 μm, 0.05 μm-0.15 μm, or is in a range defined by any of these values.

According to some embodiments, when the Au layer 320 is formed as part of industry standard packages, the thicknesses can have certain minimum values. For example, according to ASTM B-488 and MIL-DTL-45204 standards, the Au layer 320 can have minim thicknesses according to TABLES 1 and 2, respectively, or minimum thicknesses in a range defined by any of the minimum thicknesses in the respective tables.

TABLE 1

Minimum Au Thicknesses (ASTM B-488)

| Class | Minimum Thickness, μm |
|---|---|
| 0.25 | 0.25 |
| 0.50 | 0.50 |
| 0.75 | 0.75 |
| 1.0 | 1.0 |
| 1.25 | 1.25 |
| 2.5 | 2.5 |
| 5.0 | 5.0 |

TABLE 2

Minimum Au Thicknesses (MIL-DTL-45204)

| Class | Minimum Thickness (Inches) | Minimum Thickness (μm) |
|---|---|---|
| Class 00 | 0.00002 | 0.508 |
| Class 0 | 0.00003 | 0.762 |
| Class 1 | 0.00005 | 1.27 |
| Class 2 | 0.00010 | 2.54 |

TABLE 2-continued

Minimum Au Thicknesses (MIL-DTL-45204)

| Class | Minimum Thickness (Inches) | Minimum Thickness (μm) |
|---|---|---|
| Class 3 | 0.00020 | 5.08 |
| Class 4 | 0.00030 | 7.62 |
| Class 5 | 0.00050 | 12.7 |
| Class 6 | 0.00150 | 38.1 |

In the embodiments described above, selective metallization of packages and packages having metallization structures formed by selective metallization are described in connection with particular embodiments. It will be understood, however, that the principles and advantages of the embodiments can be used for any other systems, apparatus, or methods with a need for packaged IC devices. In the foregoing, it will be appreciated that any feature of any one of the embodiments can be combined and/or substituted with any other feature of any other one of the embodiments.

Formation of Different Metallization Structures on Refractory Metal Surfaces

Figure 5A:
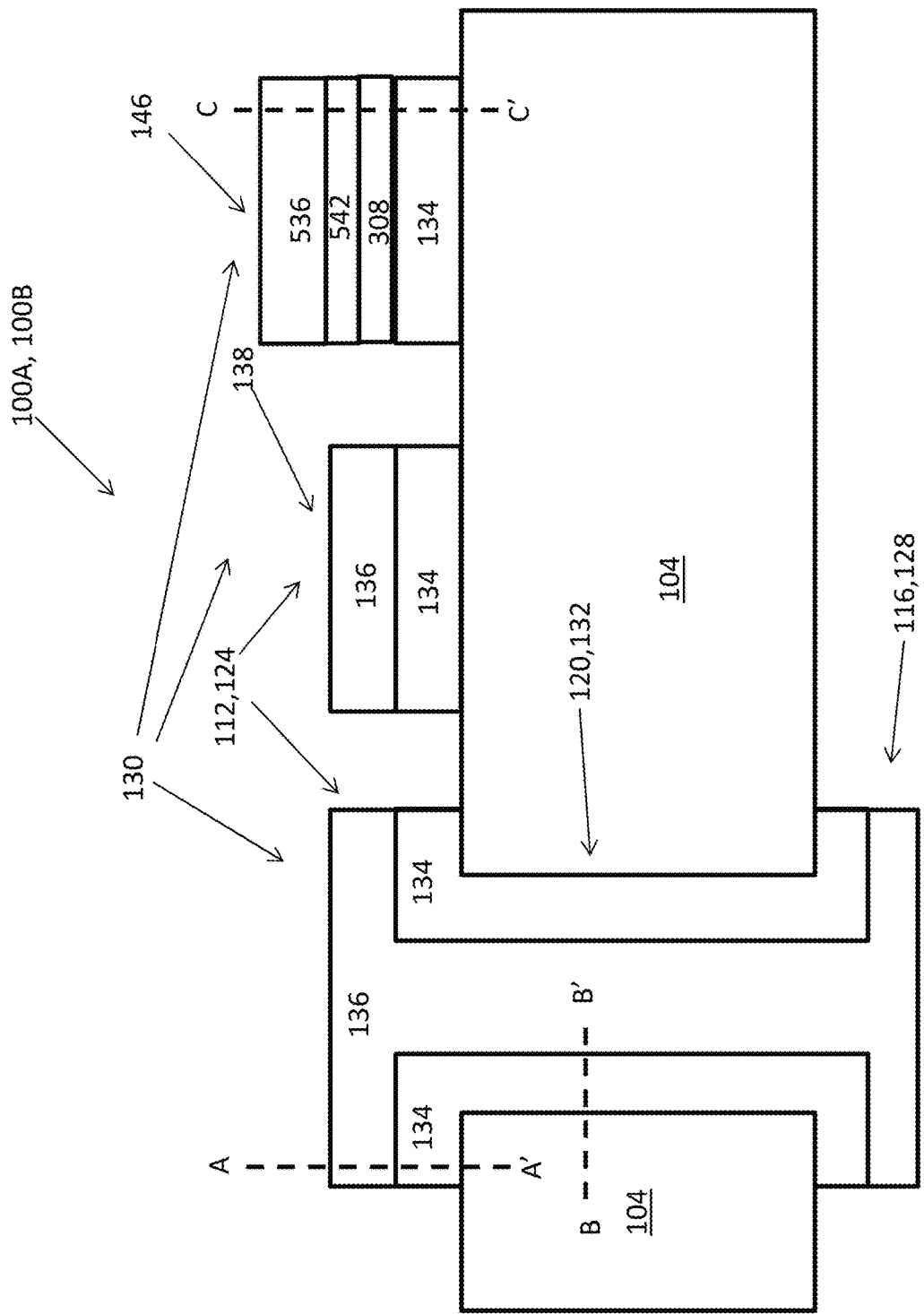
FIG. 5A illustrates a portion of the ceramic packages illustrated in FIGS. 1A and 1B, where the portion includes thermally/electrically conducting structures having different layer stacks that provide thermal/electrical communication between the IC die and an interface to the outside world, according to some embodiments.
Figure 5B:
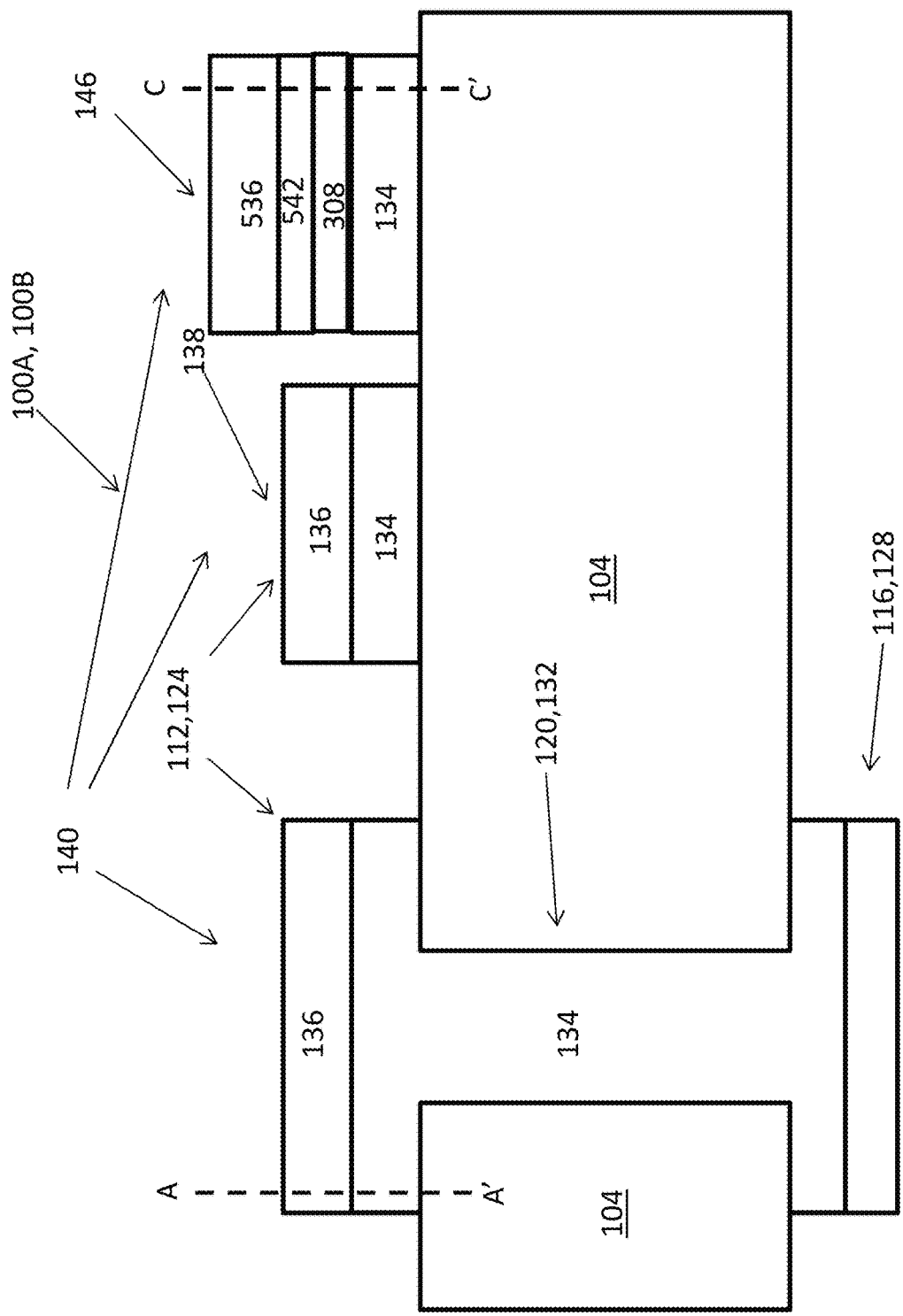
FIG. 5B illustrates a portion of the ceramic packages illustrated in FIGS. 1A and 1B, where the portion includes thermally/electrically conducting structures having different layer stacks that provide thermal/electrical communication between the IC die and an interface to the outside world, according to some other embodiments.
Figure 5C:
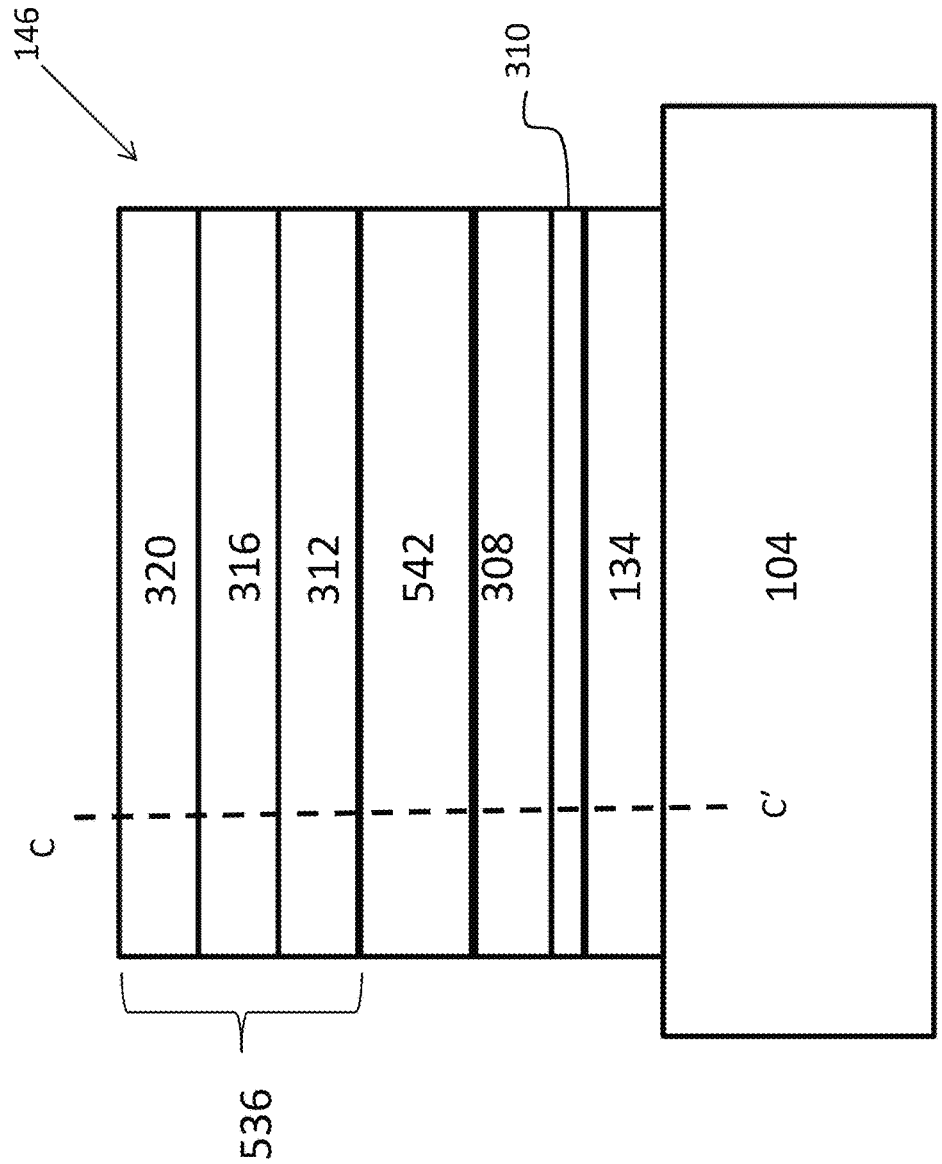
FIG. 5C illustrates a cross-sectional view of thermally/electrically conducting structures having different layer stacks, according to embodiments.

FIGS. 5A and 5B illustrate portions of the ceramic packages 100A (FIG. 1A) and/or 100B (FIG. 1B) according to alternative embodiments. As described above, various metallization structures 130, 140 (FIGS. 1C, 1D) include a stack 136 of metallization layers formed on a base metal layer 134. A detailed description of forming the base metal layer 134 and selectively forming the stack 136 of metallization layers on the base metal layer 134 to arrive at circuit elements 138 was provided with respect to FIGS. 3A-3F. As illustrated with respect to FIG. 3F, forming the stack 136 of metallization layers on the base metal layer 134 include forming the first Ni layer 308, e.g., by CVD or evaporation, plating the second Ni layer 312 on the first Ni layer 308, plating a Pd layer 316, using a electroless plating process, on the second Ni layer 312, and forming a Au layer 320, e.g., by an immersion process. In some embodiments, such as the embodiment illustrated with respect to FIGS. 1C and 1D, the circuit elements 138 include the stack 136 of metallization layers that may be formed directly on the base metal layer 134. However, embodiments are not so limited, and in the following, embodiments including circuit elements 146 having a metal layer different from the Ni layer of the stack 136 are described. FIG. 5C illustrates a detailed stack of the circuit elements 146, according to embodiments.

FIGS. 5A and 5B illustrate portions of the ceramic packages 100A (FIG. 1A) and/or 100B (FIG. 1B) having metallization structures 130, 140 that provide thermal/electrical communication between the IC die 108 (FIGS. 1A and 1B) and an interface to the outside world, e.g., a PCB, according to embodiments. Similar to the ceramic packages 100A, 100B described above with respect to FIGS. 1C, 1D, the portion of the ceramic package includes the inner thermal/electrical pad 112/124, the outer thermal/electrical pad 116/128 and the vias 120/132. Features of FIGS. 5A and 5B having the same numerical reference numerals as those described above with respect to FIGS. 1A and 1B may be the same, whose detailed description is omitted herein.

The metallization structures 130 in the illustrated embodiments of FIGS. 5A and 5B include, in addition to the one or more circuit elements 138, one or more additional circuit elements 146, e.g., a passive circuit element such as a conductor (e.g., a wire), an electrode or a resistor, among other circuit elements.

Referring to FIG. 5C, similar to the circuit elements 138, the circuit elements 146 include a base metal layer 134 comprising a refractory metal formed on or in the ceramic substrate 104 in a similar manner as described above, and a first Ni layer 308 formed on the base metal layer 134 in a similar manner as described above. Unlike the circuit elements 138, the circuit elements 146 include, on the first Ni layer 308, a metal layer 542 instead of the second Ni layer 312. According to various embodiments, the metal layer 542 comprises a metal or an alloy that is different from the second Ni layer 312 of the stack 136 of metallization layers. The metal layer 542 comprises a metal or an alloy, where the metal or the alloy comprises one or more of titanium, tungsten, silicon, carbon, aluminum, nickel, iron, cobalt, molybdenum, copper niobium platinum or silver. For example, the metal layer 142 can include an Fe—Ni—Co alloy (e.g., ASTM F15 including Kovar®), Al—Si—C alloy, Be—Cu alloy, Cu—W alloy, or Cu—Mo alloy, to name a few examples.

In some embodiments, the metal layer 542 can be formed on or attached to the base metal layer 134 using a brazing process in which the metal layer 542, which may be in the form of a preformed sheet, is attached to the base metal layer 134 using a filler metal, e.g., Ag, Cu, Ni, Cu—Ag, Cu—Zn, Cu—Sn or Au—Ag, to name a few. However, embodiments are not so limited, and the metal layer 142 may be formed using other techniques, e.g., deposition or plating.

Still referring to FIG. 5C, the circuit elements 146 further comprises, on the metal layer 542, a stack 526 second Ni layer 312 formed on the metal layer 542, a palladium (Pd) layer 316 formed on the second Ni layer 312, and a gold (Au) layer 320 formed on the Pd layer 316. The second Ni layer 312, the Pd layer 316 and the Au layer 320 can be formed in a similar manner as described above, e.g., with respect to FIGS. 3A-3F.

Advantageously, the base metal layers 134 of the circuit elements 138 and the circuit elements 146 can be formed simultaneously, using, e.g., a vapor deposition process as described above, e.g., with respect to FIGS. 3A-3F.

Similarly, some of all of corresponding layers between the stack 536 of the circuit elements 146 and the stack 136 of the circuit elements 138 can be formed simultaneously. That is, one or more of the second Ni layers 312, the Pd layers 316 and the Au layers 320 of the circuit elements 146 and the circuit element 138 can be formed simultaneously.

In the embodiments illustrated with respect to FIGS. 5A and 5B, the circuit elements 146 having the metal layer 542 is illustrated to be formed on one side of the ceramic substrate 104, e.g., inside a cavity substrate holding an IC, to form an inner electrical pad 124. However, embodiments are not so limited, and the metal layer 142 can be formed as part of one or both of thermal and electrical vias 120 and 132 illustrated in FIGS. 5A and 5B.

Advantageously, as illustrated with respect to FIGS. 5A and 5B, the circuit elements 138 and of the circuit elements 146 are formed on the same ceramic substrate 104. However, embodiments are not so limited, and the circuit elements 138 and of the circuit elements 146 may be formed on different substrates.

In some embodiments, the circuit elements 138 are omitted, while the circuit elements 146 are present. In these embodiments, all of the circuit elements 146 may include the metal layer 542.

Figure 6:
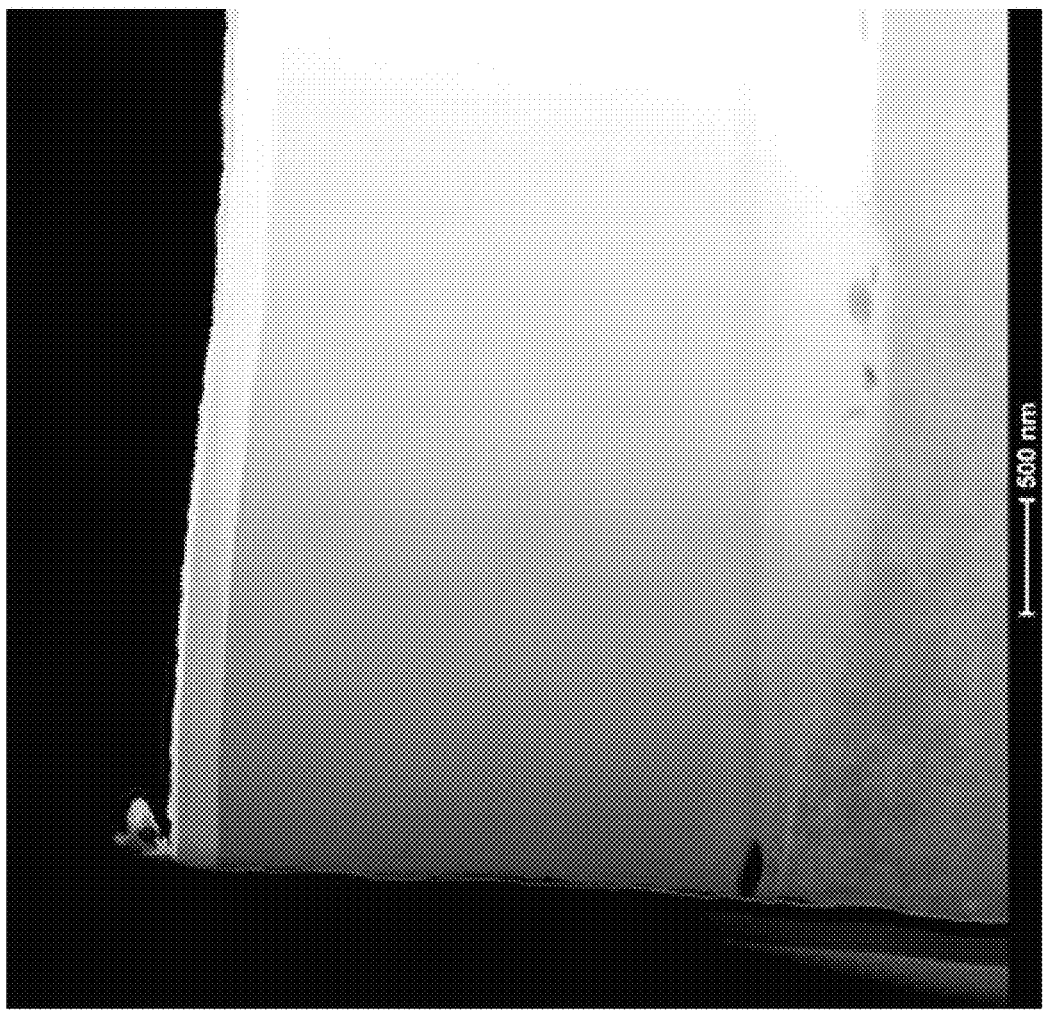
FIG. 6 is a cross-sectional view scanning electron micrograph of a layer stack including a Ni/Fe/Co alloy layer, an electroless nickel layer, an electroless Pd and a Au layer formed by an immersion process, according to embodiments.

FIG. 6 is a cross-sectional view scanning electron micrograph of an example layer stack including a metal layer 142 and a layer stack 136, according to embodiments. In the illustrated example, from the bottom of the micrograph, the illustrated metal layer 142 is a 50-250 microinches of Ni/Fe/Co alloy layer (referred to in the industry as Kovar©, and the layer stack 136 formed thereon includes an electroless nickel layer (50-250 microinches), an electroless Pd layer (5-10 microinches) and a Au layer (2-6 microinches) formed by an immersion process.

Figure 7:
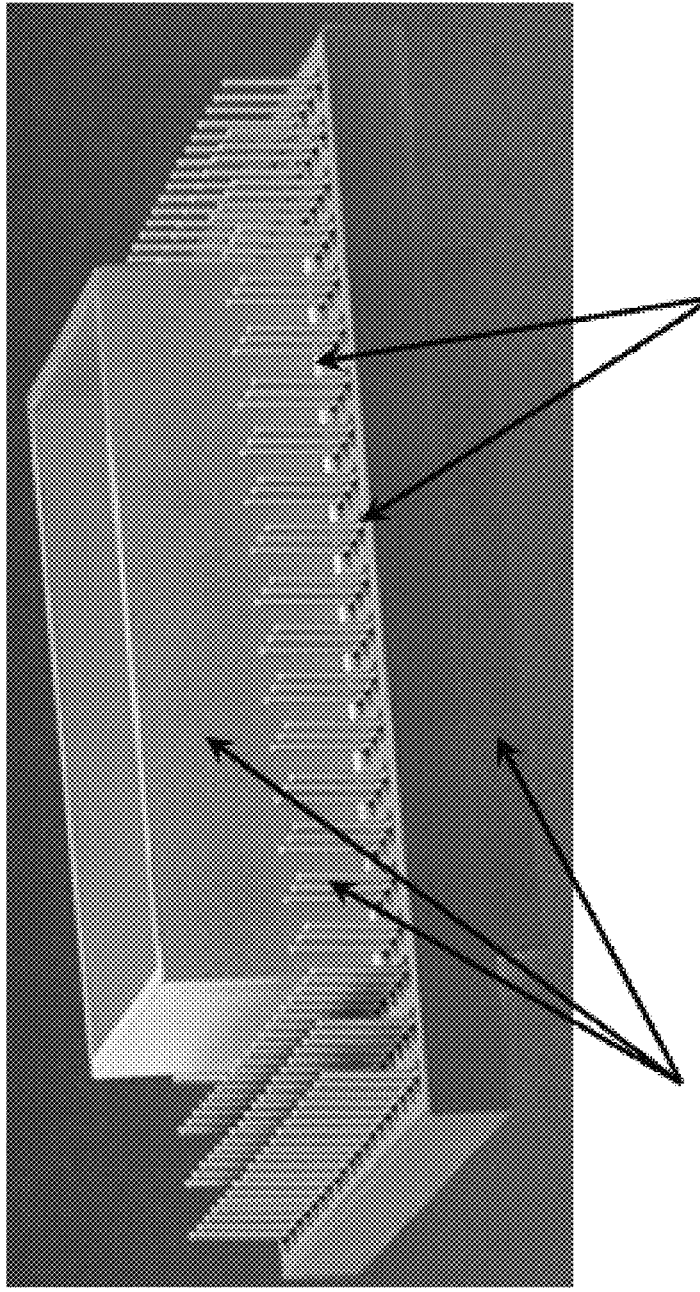
FIG. 7 is a perspective view of a ceramic package comprising different thermally/electrically conducting structures having layer stacks described with respect to FIGS. 5A and 5B.

FIG. 7 illustrates an example ceramic package including different forms of circuit elements 138 (not shown) and 146 having the structure described above with respect to FIGS. 5A-5C. The circuit elements 146 can include, in addition to various structures described above, such as pads, vias, circuit elements, etc., pins and seal rings comprising the base metal layer 134, the metal layer 542 and the stack 536, as described above with respect to FIGS. 5A-5C.

The inventors have found that ceramic packages fabricated according to various embodiments herein have been demonstrated to pass various industry standard tests, as shown below in TABLE. 1.

TABLE 1

Demonstrated Acceptance Criteria of Microelectronic Mixed Ceramic and Metal Assemblies

| Evaluation | Test Method | Description | Result |
| --- | --- | --- | --- |
| Adhesion | ASTM B488 | Mechanical - Adhesion Testing | pass |
| Heat Resistance | ASTM B488 | Environmental - 325° C. for 30 min | pass |
| Wire bond | MIL-STD 883 method 2011 Condition D | Mechanical - wire bond reliability | pass |
| Solderability | MIL-STD 883 method 2003 | Mechanical Solder dip evaluation | pass |
| Solderability (Steam Age) | MIL-STD 883 method 2009 | Mechanical/Environmental - preconditioning | pass |
| Salt Spray | MIL-STD 883 method 2004 | Environmental - 24 hour corrosion resistance | pass |

Figure 8A:
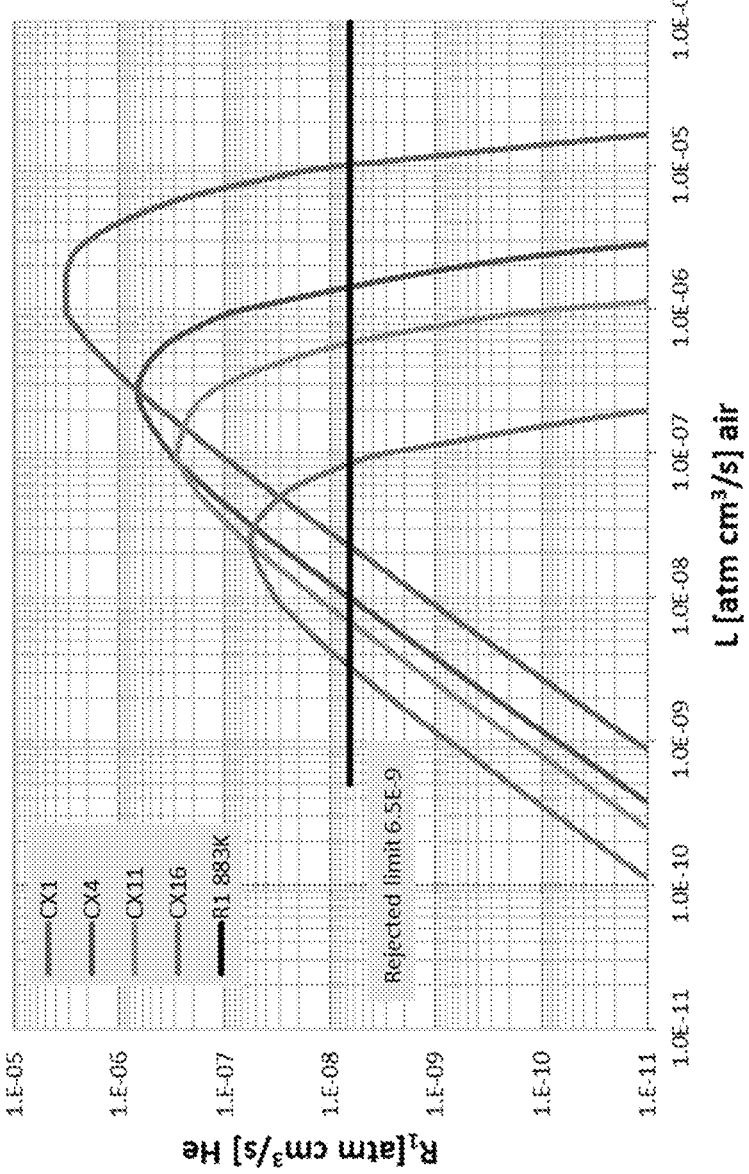
FIGS. 8A and 8B show experimental leak rate testing results performed on ceramic substrates having hermetically sealed integrated circuit dies therein, according to embodiments.
Figure 8B:
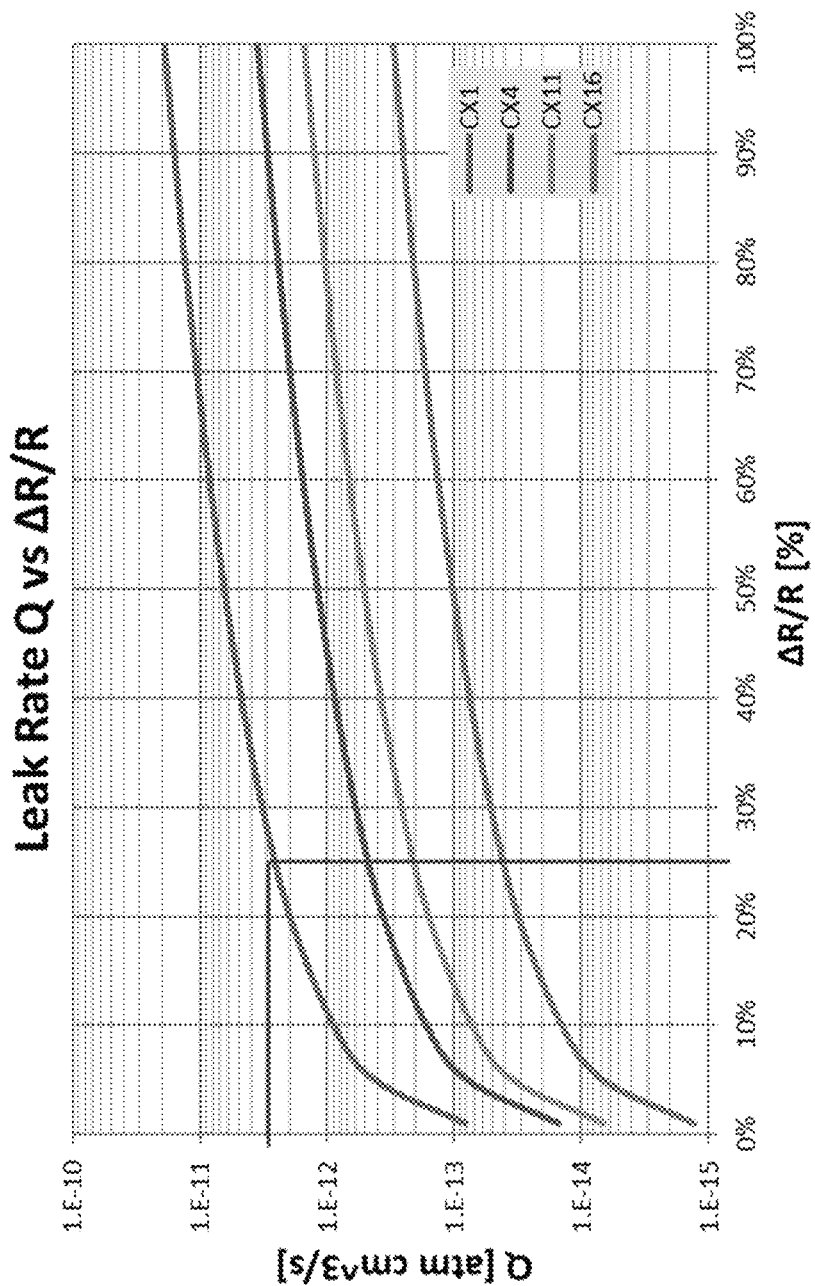

FIGS. 8A and 8B show experimental leak rate testing results performed on ceramic substrates having hermetically sealed integrated circuit dies therein, according to embodiments. FIG. 8A illustrates experimental fine leak tests performed on a volume that has been hermetically sealed using various structures and processes disclosed herein, using a commercially available helium leak detector, and analyzed according to what is known in the art as Howl-Mann Equation. The graph in FIG. 8A shows a measured leakage rate ($R_1$) as a function of a true leakage rate (L) measured after a dwell time ($t_2$) between release of pressure and leak detection of 3600 seconds. For all samples tested, the detectable leak rate was about $1\times10^{-9}$ atm cm$^3$/sec. The graph in FIG. 8B illustrates experimental fine leak tests performed on a volume enclosing a quartz tuning fork that has been hermetically by measuring the change in resistance of the tuning fork itself. For all samples tested, the detectable leak rate was about $1\times10^{-14}$-$1\times10^{-12}$ atm cm$^3$/sec.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," "infra," "supra," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All suitable combinations and subcombinations of features of this disclosure are intended to fall within the scope of this disclosure.

What is claimed is:

1. A ceramic package comprising:
   a ceramic package substrate configured to house an electronic component therein;

a metallization structure configured to electrically connect the electronic component to the outside world, the metallization structure comprising:
  a base metal layer comprising a refractory metal formed on the ceramic package substrate,
  a nickel (Ni)-based layer deposited on the base metal layer, wherein the Ni-based layer is a Ni layer having phosphorous (P) and boron (B) each at a concentration less than 0.01 weight (wt.) %,
  a plated Ni layer plated over the Ni-based layer and having a different composition from the Ni-based layer, the plated Ni layer comprising P at a concentration exceeding the concentration of P in the Ni-based layer,
  a palladium (Pd) layer plated on the plated Ni layer, wherein the Pd layer has a thickness of 0.05 µm to 0.5 µm, and
  a gold (Au) layer plated on the Pd layer.

2. The ceramic package of claim 1, wherein the Ni-based layer is an alloy comprising Ni.

3. The ceramic package of claim 1, wherein the ceramic package further comprises a via extending through the ceramic package substrate and electrically connected to the metallization structure.

4. The ceramic package of claim 3, wherein the via is configured to electrically connect the electronic component at one end and an external circuit or component at the other end.

5. The ceramic package of claim 4, wherein the via has formed on opposing ends thereof one or more of the Ni-based layer, the plated Ni layer, the Pd layer and the Au layer.

6. The ceramic package of claim 4, wherein the via has formed therein one or more of the Ni-based layer, the plated Ni layer, the Pd layer and the Au layer that are co-deposited with respective ones of the Ni-based layer, the plated Ni layer, the Pd layer and the Au layer of the metallization structure.

7. The ceramic package of claim 4, wherein the base metal layer comprises upper and lower portions formed on opposing major surfaces of the ceramic package substrate and further having a via portion extending through the via and connecting the upper and lower portions, wherein the upper, lower and via portions of the base metal layer form a continuous layer having the same composition and thickness.

8. The ceramic package of claim 1, further comprising a metal layer interposed between the Ni-based layer and the plated Ni layer, wherein the metal layer is formed of a different metal from the Ni-based layer and the plated Ni layer.

9. The ceramic package of claim 8, wherein the metal layer is a single metal layer contacting the Ni-base layer and the plated Ni layer.

10. The ceramic package of claim 1, wherein the Pd layer comprises P.

11. The ceramic package of claim 1, further comprising:
  an outer electrical pad on an outer surface of the ceramic package, wherein the outer electrical pad comprises the metallization structure.

12. The ceramic package of claim 1, wherein the ceramic package substrate has opposing first and second sides, wherein the metallization structure comprises a first metallization structure that is formed on the first side and comprises the base metal layer, the Ni-based layer, and the Au layer comprise a first base metal layer, a first Ni-based layer, and a first Au layer, respectively, and wherein the ceramic package further comprises:
  a second metallization structure on the second side of the ceramic package substrate, wherein the second metallization structure comprises:
    a second base metal layer comprising the refractory metal;
    a second Ni-based layer deposited on the second base metal layer; and
    a second Au layer formed over the second Ni-based layer.

13. The ceramic package of claim 12, wherein the plated Ni layer comprises a first plated Ni layer, wherein the Pd layer comprises a first Pd layer, and wherein the second metallization structure comprises:
  a second plated Ni layer plated over the second Ni-based layer; and
  a second Pd layer plated on the second plated Ni layer.

14. The ceramic package of claim 13, wherein the second Au layer is plated on the second Pd layer.

15. The ceramic package of claim 13, wherein the second plated Ni layer and the second Pd layer are co-deposited with the first Ni layer and the first Pd layer.

16. The ceramic package of claim 12, wherein the first and second metallization structures are co-deposited.

17. The ceramic package of claim 1, further comprising:
  a through-substrate structure that extends from a first surface of the ceramic package substrate to a second surface of the ceramic package substrate, wherein the through-substrate structure comprises the metallization structure.

18. The ceramic package of claim 17, wherein the through-substrate structure comprises a first end portion formed on the first surface and a second end portion formed on the second surface, and wherein the first and second end portions both include the base metal layer and least one of the Ni-based layer, the plated Ni layer, the Pd layer, and the Au layer.

19. A ceramic package comprising:
  a ceramic package substrate comprising a cavity configured to house an electronic component therein;
  an inner metallization structure formed on an inner surface of the ceramic package substrate and configured to connect to the electronic component; and
  an outer metallization structure formed on an outer surface of the ceramic package substrate and configured to connect to an external circuit or component,
  wherein the inner and outer metallization structures are electrically connected to each other and comprise co-deposited ones of:
    a base metal layer comprising a refractory metal formed on the ceramic package substrate,
    a nickel (Ni)-based layer deposited on the base metal layer,
    a plated Ni layer formed over the Ni-based layer and having a different chemical composition from the Ni-based layer,
    a palladium (Pd) layer plated on the plated Ni layer, and
    a gold (Au) layer plated on the palladium layer.

20. The ceramic package of claim 19, wherein the ceramic package further comprises a via extending through the ceramic package substrate, wherein the via electrically connects the inner metallization structure and the outer metallization structure.

21. The ceramic package of claim 20, wherein the via has formed on opposing ends thereof the inner metallization structure and the outer metallization structure.

22. The ceramic package of claim 20, wherein the via has formed therein one or more of the Ni-based layer, the plated Ni layer, the Pd layer and the Au layer that are co-deposited with respective ones of the Ni-based layer, the plated Ni layer, the Pd layer and the Au layer of the inner and outer metallization structures.

23. The ceramic package of claim 19, wherein the plated Ni layer comprises phosphorous (P) or boron (B).

24. The ceramic package of claim 23, wherein the Ni-based layer is an alloy comprising Ni.

25. The ceramic package of claim 23, wherein the Ni-based layer is a Ni layer deposited using a vapor deposition process and having P and B each at a concentration less than 0.01 wt. %.

26. The ceramic package of claim 19, further comprising a metal layer interposed between the Ni-based layer and the plated Ni layer, wherein the metal layer is formed of a different material from the Ni-based layer and the plated Ni layer.

27. A packaged electronic component, comprising:
a ceramic package substrate having a cavity housing therein an electronic component and also having a via that extends through the ceramic package substrate; and
a metallization structure formed on the ceramic package substrate and electrically connected to the electronic component, the metallization structure comprising:
a base metal layer comprising a refractory metal formed on the ceramic package substrate,
a nickel (Ni)-based layer deposited on the base metal layer,
a plated Ni layer formed over the Ni-based layer and having a different chemical composition from the Ni-based layer,
a palladium (Pd) layer plated on the plated Ni layer, and
a gold (Au) layer plated on the Pd layer, wherein a portion of the base metal layer and a portion of at least one of the Ni-based layer, the plated Ni layer, the Pd layer, and the Au layer extend through the via.

28. The packaged electronic component of claim 27, wherein the metallization structure is formed on an outer surface of the ceramic package substrate, and wherein the metallization structure is connected to the electronic component by the via.

29. The packaged electronic component of claim 28, further comprising an inner metallization formed on an inner surface of the ceramic package substrate, the inner metallization comprising one or more of the Ni-based layer, the plated Ni layer, the Pd layer and the Au layer.

30. The packaged electronic component of claim 27, wherein the ceramic package is configured to hermetically seal the electronic component within the cavity such that a leak rate of the ceramic package substrate and the via is $1 \times 10^{-14}$-$1 \times 10^{-12}$ atm cm$^3$/sec for helium.

* * * * *